United States Patent
Eitan

(12) 
(10) Patent No.: US 6,552,387 B1
(45) Date of Patent: Apr. 22, 2003

(54) NON-VOLATILE ELECTRICALLY ERASABLE AND PROGRAMMABLE SEMICONDUCTOR MEMORY CELL UTILIZING ASYMMETRICAL CHARGE TRAPPING

(75) Inventor: Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 09/211,981

(22) Filed: Dec. 14, 1998

Related U.S. Application Data

(62) Division of application No. 08/902,890, filed on Jul. 30, 1997.

(51) Int. Cl.⁷ .............................................. H01L 29/792
(52) U.S. Cl. ................... 257/324; 365/185.33
(58) Field of Search ....................... 257/324; 365/185.33

(56) References Cited

U.S. PATENT DOCUMENTS

| | | |
|---|---|---|
| 3,895,360 A | 7/1975 | Cricchi et al. |
| 4,016,588 A | 4/1977 | Ohya et al. |

(List continued on next page.)

FOREIGN PATENT DOCUMENTS

| | | |
|---|---|---|
| EP | 0751560 | 1/1997 |
| GB | 1297899 | 11/1972 |
| GB | 2157489 | 10/1985 |
| JP | 05021758 | 1/1993 |
| JP | 07193151 | 7/1995 |
| JP | 09162314 | 6/1997 |
| WO | WO 81/00790 | 3/1981 |
| WO | WO 96/25741 | 8/1996 |

OTHER PUBLICATIONS

T.Y. Chan et al., *A True Single–Transistor Oxide–Nitride–Oxide EEPROM Device*, Mar. 1987, IEEE Electron Device Letters, vol. EDL–8, No. 3, pp. 93–95.

(List continued on next page.)

*Primary Examiner*—Sara Crane
(74) *Attorney, Agent, or Firm*—Eitan, Pearl, Latzer & Cohen-Zedek

(57) ABSTRACT

An electrically erasable programmable read only memory (EEPROM) having a non conducting charge trapping dielectric, such as silicon nitride, sandwiched between two silicon dioxide layers acting as electrical insulators is disclosed. The invention includes a method of programming, reading and erasing the EEPROM device. The non conducting dielectric layer functions as an electrical charge trapping medium. A conducting gate layer is placed over the upper silicon dioxide layer. The memory device is programmed in the conventional manner, using hot electron programming, by applying programming voltages to the gate and the drain while the source is grounded. Hot electrons are accelerated sufficiently to be injected into the region of the trapping dielectric layer near the drain. The device, however, is read in the opposite direction from which it was written, meaning voltages are applied to the gate and the source while the drain is grounded. Application of relatively low gate voltages combined with reading in the reverse direction greatly reduces the potential across the trapped charge region. This permits much shorter programming times by amplifying the effect of the charge trapped in the localized trapping region. In addition, the memory cell can be erased by applying suitable erase voltages to the gate and the drain so as to cause electrons to be removed from the charge trapping region of the nitride layer. Similar to programming, a narrower charge trapping region enables much faster erase cycles.

15 Claims, 12 Drawing Sheets

U.S. PATENT DOCUMENTS

| | | | |
|---|---|---|---|
| 4,017,888 A | 4/1977 | Christie et al. | |
| 4,151,021 A | 4/1979 | McElroy | |
| 4,173,766 A | 11/1979 | Hayes | |
| 4,173,791 A | 11/1979 | Bell | |
| 4,257,832 A | 3/1981 | Schwabe et al. | |
| 4,306,353 A | 12/1981 | Jacobs et al. | |
| 4,342,149 A | 8/1982 | Jacobs et al. | |
| 4,360,900 A | 11/1982 | Bate | |
| 4,380,057 A | 4/1983 | Kotecha et al. | |
| 4,471,373 A | 9/1984 | Shimizu et al. | |
| 4,521,796 A | 6/1985 | Rajkanan et al. | |
| 4,527,257 A | 7/1985 | Cricchi | |
| 4,586,163 A | 4/1986 | Koike | |
| 4,630,085 A | 12/1986 | Koyama | |
| 4,667,217 A | 5/1987 | Janning | |
| 4,742,491 A | 5/1988 | Liang et al. | |
| 4,769,340 A | 9/1988 | Chang et al. | |
| 4,780,424 A | 10/1988 | Holler et al. | |
| 4,847,808 A | 7/1989 | Kobatake | |
| 4,870,470 A | 9/1989 | Bass, Jr. et al. | |
| 4,941,028 A | 7/1990 | Chen et al. | |
| 5,021,999 A | 6/1991 | Kohda et al. | |
| 5,042,009 A | 8/1991 | Kazerounian | |
| 5,075,245 A | 12/1991 | Woo et al. | |
| 5,104,819 A | 4/1992 | Freiberger et al. | |
| 5,159,570 A | 10/1992 | Mitchell et al. | 365/185 |
| 5,168,334 A | 12/1992 | Mitchell et al. | |
| 5,172,338 A | 12/1992 | Mehrotra et al. | 365/185 |
| 5,175,120 A | 12/1992 | Lee | |
| 5,214,303 A | 5/1993 | Aoki | |
| 5,260,593 A | 11/1993 | Lee | |
| 5,293,563 A | 3/1994 | Ohta | |
| 5,295,108 A | 3/1994 | Higa | |
| 5,305,262 A | 4/1994 | Yoneda | |
| 5,311,049 A | 5/1994 | Tsuruta | |
| 5,324,675 A | 6/1994 | Hayabuchi | |
| 5,338,954 A * | 8/1994 | Shimoji | 257/324 |
| 5,345,425 A | 9/1994 | Shikatani | |
| 5,349,221 A | 9/1994 | Shimoji | 257/324 |
| 5,350,710 A | 9/1994 | Hong et al. | |
| 5,359,554 A | 10/1994 | Odake et al. | |
| 5,375,094 A | 12/1994 | Naruke | |
| 5,393,701 A | 2/1995 | Ko et al. | |
| 5,394,355 A | 2/1995 | Uramoto et al. | |
| 5,412,601 A | 5/1995 | Sawada et al. | |
| 5,414,693 A | 5/1995 | Ma et al. | |
| 5,418,176 A | 5/1995 | Yang et al. | |
| 5,418,743 A | 5/1995 | Tomioka et al. | |
| 5,422,844 A | 6/1995 | Wolstenholme et al. | |
| 5,424,567 A | 6/1995 | Chen | |
| 5,424,978 A | 6/1995 | Wada et al. | |
| 5,426,605 A | 6/1995 | Van Berkel et al. | |
| 5,434,825 A | 7/1995 | Harari | |
| 5,436,481 A | 7/1995 | Egawa et al. | |
| 5,440,505 A | 8/1995 | Fazio et al. | |
| 5,450,341 A | 9/1995 | Sawada et al. | |
| 5,450,354 A | 9/1995 | Sawada et al. | |
| 5,455,793 A | 10/1995 | Amin et al. | |
| 5,467,308 A | 11/1995 | Chang et al. | |
| 5,477,499 A | 12/1995 | Van Buskirk et al. | 365/218 |
| 5,496,753 A | 3/1996 | Sakurai et al. | |
| 5,518,942 A | 5/1996 | Shrivastava | |
| 5,523,251 A | 6/1996 | Hong | |
| 5,553,018 A | 9/1996 | Wang et al. | |
| 5,563,823 A | 10/1996 | Yiu et al. | |
| 5,592,417 A | 1/1997 | Mirabel | 365/185.07 |
| 5,599,727 A | 2/1997 | Hakozaki et al. | |
| 5,606,523 A | 2/1997 | Mirabel | 365/185.05 |
| 5,654,568 A | 8/1997 | Nakao | |
| 5,656,513 A | 8/1997 | Wang et al. | |
| 5,712,814 A | 1/1998 | Fratin et al. | |
| 5,726,946 A | 3/1998 | Yamagata et al. | |
| 5,751,037 A | 5/1998 | Aozasa et al. | |
| 5,754,475 A | 5/1998 | Bill et al. | 365/185.25 |
| 5,760,445 A | 6/1998 | Diaz | |
| 5,768,192 A | 6/1998 | Eitan | |
| 5,787,036 A | 7/1998 | Okazawa | |
| 5,793,079 A | 8/1998 | Georgescu et al. | 257/316 |
| 5,801,076 A | 9/1998 | Ghneim et al. | |
| 5,812,449 A | 9/1998 | Song | 365/185.03 |
| 5,825,686 A | 10/1998 | Schmitt-Landsiedel | 365/185.03 |
| 5,836,772 A | 11/1998 | Chang et al. | |
| 5,841,700 A | 11/1998 | Chang | 365/185.18 |
| 5,847,441 A | 12/1998 | Cutter et al. | |
| 5,864,164 A | 1/1999 | Wen | |
| 5,870,335 A | 2/1999 | Khan et al. | |
| 5,886,927 A | 3/1999 | Takeuchi | |
| 5,903,031 A | 5/1999 | Yamada et al. | |
| 5,946,558 A | 8/1999 | Hsu | |
| 5,963,412 A | 10/1999 | En | |
| 5,973,373 A | 10/1999 | Krautschneider et al. | |
| 5,991,202 A | 11/1999 | Derhacobian et al. | |
| 6,018,186 A | 1/2000 | Hsu | |
| 6,020,241 A | 2/2000 | You et al. | |
| 6,028,324 A | 2/2000 | Su et al. | |
| 6,030,871 A | 2/2000 | Eitan | |
| 6,034,403 A | 3/2000 | Wu | |
| 6,034,896 A | 3/2000 | Ranaweera et al. | |
| 6,063,666 A | 5/2000 | Chang et al. | |
| 6,215,148 B1 | 4/2001 | Eitan | |
| 6,285,574 B1 | 9/2001 | Eitan | |
| 6,308,485 B1 | 10/2001 | Harari et al. | |
| 6,348,711 B1 | 2/2002 | Eitan | |

OTHER PUBLICATIONS

Boaz Eitan et al., *Hot–Electron Injection into the Oxide in n–Channel MOS Devices*, Mar. 1981, IEEE Transactions on Electron Devices, vol. ED–28, No. 3, pp. 328–340.

Lance A. Glasser et al., *The Design and Analysis of VLSI Circuits*, Addison–Wesley Publishing Company, Jul. 1988, Chapter 2, pp. 67–163.

Anirban Roy, "Characterization and Modeling of Charge Trapping and Retention in Novel Multi–Dielectic Nonvolatile Semiconductor Memory Device," *Sherman Fairchild Center Department of Computer Science and Electrical Engineering*, pp. 1–35 (1989).

U.S. patent application Ser. No. 08/902,890, Eitan, filed May 04, 2000.

U.S. patent application Ser. No. 08/905,286, Eitan, filed Jul. 30, 1997.

U.S. patent application Ser. No. 09/536,125, Eitan, filed Mar. 25, 2000.

Chan et al., "A True Single–Transistor Oxide–Nitride–Oxide EEPROM Device," *IEEE Electron Device Letters*, vol. EDL–8, No. 3, Mar. 1987.

Change, J., "Non Volatile Semiconductor Memory Devices," *Proceedings of the IEEE*, vol. 64 No. 7, issued Jul. 1976.

Etian et al., "Hot–Electron Injection into the Oxide in n–Channel MOS Devices," *IEEE Transactions on Electron Devices*, vol. ED–38, No. 3, pp. 328–340, Mar. 1981.

Glasser et al., "The Design and Analysis of VLSI Circuits," Addison Wesley Publishing Co, Chapter 2, 1988.

Lee, H., "A New Approach For the Floating–Gate Mos NonVolatile Memory", *Applled Physics Letters*, vol. 31, No. 7, pp. 475–6, Oct. 1977.

Ma et al., "A dual–bit Split–Gate EEPROM (DSG) Cell In Contactless Array for Single–Vcc High Density Flash Memories," *IEEE*, pp. 3.5.1–3.5.4. 1994.

Oshima et al., "Process and Device Technologies for 16Mbit Eproms with Large –Tilt –Angle implanted P–Pocket Cell," *IEEE*, CH2865–4/90/0000–0095, pp. 5.2.1–5.2.4, 1990.

Ricco, Bruno, "Nonvolatile Multilevel Memories for Digital Application," *IEEE*, vol. 86, No. 12, pp. 2399–2421, issued 1998.

Roy, Anariban "Characterization and Modeling of Charge Trapping and Retention in Novel Multi–Dielectic Nonvolatile Semiconductor Memory Device," Doctoral Dissertation, Sherman Fairchild Center, Department of Computer Science and Electrical Engineering, pp. 1–35, 1989.

"2 Bit/Cell EEPROM Cell Using Band–To–Band Tunneling For Data Read–Out," *IBM Technical Disclosure Bulletin*, U.S. IBM Corp. NY vol. 35, No. 4B, ISSN:0018–8689, Sep. 1992.

Hsing–Huang Tseng et al. "Thin CVD Gate Dielectric for ULSI Technology", *IEEE*, 0–7803–1450–6, 1993.

Pickar, K.A., "Ion Implantation in Sillcon," *Applied Solid State Science*, vol. 5, R. Wolfe Edition, Academic Press, New York, 1975.

Bhattacharyya et al., "FET Gate Structure for Nonvolatile N–Channel Read–Mostly Memory Device," *IBM Technical Disclosure Bulletin*, U.S. IBM Corp. vol. 18, No. 6, p. 1768, 1976.

\* cited by examiner

NON-VOLATILE ELECTRICALLY ERASABLE AND PROGRAMMABLE SEMICONDUCTOR MEMORY CELL UTILIZING ASYMMETRICAL CHARGE TRAPPING

This is a division of Ser. No. 08/902,890 filed Jul. 30, 1997.

FIELD OF THE INVENTION

The present invention relates generally to semiconductor memory devices and more particularly to flash electrically erasable programmable read only memory (EEPROM) cells that utilize the phenomenon of hot electron injection to trap charge within a trapping dielectric material within the gate.

BACKGROUND OF THE INVENTION

Memory devices for non-volatile storage of information are currently in widespread use today, being used in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

Semiconductor ROM devices, however, suffer from the disadvantage of not being electrically programmable memory devices. The programming of a ROM occurs during one of the steps of manufacture using special masks containing the data to be stored. Thus, the entire contents of a ROM must be determined before manufacture. In addition, because ROM devices are programmed during manufacture, the time delay before the finished product is available could be six weeks or more. The advantage, however, of using ROM for data storage is the low cost per device. However, the penalty is the inability to change the data once the ROM has been manufactured. If mistakes in the data programming are found they are typically very costly to correct. Any ROM inventory that exists having incorrect data programming is instantly obsolete and probably cannot be used. In addition, extensive time delays are incurred because new masks must first be generated from scratch and the entire manufacturing process repeated, at least from the ROM programming mask step. Also, the cost savings in the use of ROM memories only exist if large quantities of the ROM are produced.

Moving to EPROM semiconductor devices eliminates the necessity of mask programming the data but the complexity of the process increases drastically. In addition, the die size is larger due to the addition of programming circuitry and there are more processing and testing steps involved in the manufacture of these types of memory devices. An advantage of EPROMs is that they are electrically programmed, but for erasing, EPROMs require exposure to ultraviolet (UV) light. EPROM dice are placed in packages with windows transparent to UV light to allow each die to be exposed for erasing, which must be performed before the device can be programmed. A major drawback to these devices is that they lack the ability to be electrically erased. In many circuit designs it is desirable to have a non-volatile memory device that can be erased and reprogrammed in-circuit, without the need to remove the device for erasing and reprogramming.

Semiconductor EEPROM devices also involve more complex processing and testing procedures than ROM, but have the advantage of electrical programming and erasing. Using EEPROM devices in circuitry permits in-circuit erasing and reprogramming of the device, a feat not possible with conventional EPROM memory. Flash EEPROMs are similar to EEPROMs in that memory cells can be programmed (i.e., written) and erased electrically but with the additional ability of erasing all memory cells at once, hence the term flash EEPROM. The disadvantage of flash EEPROM is that it is very difficult and expensive to manufacture and produce.

The widespread use of EEPROM semiconductor memory has prompted much research focusing on constructing better memory cells. Active areas of research have focused on developing a memory cell that has improved performance characteristics such as shorter programming times, utilizing lower voltages for programming and reading, longer data retention times, shorter erase times and smaller physical dimensions. One such area of research involves a memory cell that has an insulated gate. The following prior art reference is related to this area.

U.S. Pat. No. 4,173,766, issued to Hayes, teaches a metal nitride oxide semiconductor (MNOS) constructed with an insulated gate having a bottom silicon dioxide layer and a top nitride layer. A conductive gate electrode, such as polycrystalline silicon or metal, is placed on top of the nitride layer. A major disadvantage of this device is the difficulty in using it to construct a flash EEPROM. A consequence of using an oxide-nitride structure as opposed to an oxide-nitride-oxide structure is that during programming the charge gets distributed across the entire nitride layer. The absence of the top oxide layer lowers the ability to control where the charge is stored in the nitride layer.

Further, in the memory cell disclosed in Hayes, the nitride layer is typically 350 Angstroms thick. A thick nitride layer is required in Hayes' device in order to achieve sufficient charge retention. Due to the thick nitride layer, very high vertical voltages are needed for erasing. The relatively thick nitride layer causes the distribution of charge, i.e., the charge trapping region, to be very wide and a wider charge trapping region makes erasing the cell via the drain extremely difficult if not impossible. Thus, the memory cell taught by Hayes must have a thick nitride layer-for charge retention purposes but at the expense of making it extremely difficult to erase the device via the drain, thus making the device impractical for flash EEPROM applications.

To erase the memory cell of Hayes, the electrons previously trapped in the nitride must be neutralized either by moving electrons out of the nitride or by transferring holes into the nitride. Hayes teaches an erase mode for his memory cell whereby the information stored on the nitride is erased by grounding the gate and applying a sufficient potential to the drain to cause avalanche breakdown. Avalanche breakdown involves hot hole injection into the nitride in contrast to electron injection. Avalanche breakdown, however, requires relatively high voltages and high currents for the phenomenon to occur. To lower the avalanche breakdown voltage, a heavily doped impurity is implanted into the channel between the source and the drain.

The hot holes are generated and caused to surmount the hole potential barrier of the bottom oxide and recombine with the electrons in the nitride. This mechanism, however, is very complex and it is difficult to construct memory devices that work in this manner. Another disadvantage of using hot hole injection for erase is that since the PN junction between the drain and the channel is in breakdown, very large currents are generated that are difficult to control. Further, the number of program/erase cycles that the memory cell can sustain is limited because the breakdown damages the junction area. The damage is caused by the very high local temperatures generated in the vicinity of the junction when it is in breakdown.

In addition, it is impractical to use the memory device of Hayes in a flash memory array architecture. The huge currents generated during erase using avalanche breakdown would cause significant voltage (i.e., IR), drops along the bit line associated with the memory cell in breakdown.

Another well known technique of erasing is to inject holes from the gate into the nitride layer. This mechanism, however, is very complex and difficult to control due to the higher mobility of holes versus electrons in the nitride. With elevated temperatures, the higher mobility of holes causes a large loss of charge retention and consequently lower threshold voltage deltas. Deep depletion phenomena create the need for a companion serial device to control the programming/erase process.

U.S. Pat. No. 5,168,334, issued to Mitchell et al., teaches a single transistor EEPROM memory cell. Mitchell, however, teaches an oxide-nitride-oxide (ONO) EEPROM memory cell wherein oxide-nitride-oxide layers are formed above the channel area and between the bit lines for providing isolation between overlying polysilicon word lines. The nitride layer retains charge to program the memory cell.

Although the memory device of Mitchell includes a top oxide layer, it is not very well suited for flash EEPROM applications. This is due to the very wide change trapping region that must be programmed in order to achieve a sufficient delta in the threshold voltage between programming and reading. The Mitchell device is programmed and read in the forward direction. Since reading in the forward direction is less effective than reading in the reverse direction, the charge trapping region must be wider by default in order to distinguish between the programmed and unprogrammed states. A wider charge trapping region, however, makes the memory device very difficult to erase, thus making this device inefficient for flash EEPROM applications.

A single transistor ONO EEPROM device is disclosed in the technical article entitled "A True Single-Transistor Oxide-Nitride-Oxide EEPROM Device," T. Y. Chan, K. K. Young and Chenming Hu, IEEE Electron Device Letters, March 1987. The memory cell is programmed by hot electron injection and the injected charges are stored in the oxide-nitride-oxide (ONO) layer of the device. This article teaches programming and reading in the forward direction. Thus, as in Mitchell, a wider charge trapping region is required to achieve a sufficiently large difference in threshold voltages between programming and reading. This, however, makes it much more difficult to erase the device.

SUMMARY OF THE INVENTION

In accordance with the present invention, a flash electrically erasable programmable read only memory (EEPROM) and method of programming, reading and erasing the same are provided. In one embodiment, the flash EEPROM memory cell is constructed having a charge trapping dielectric layer sandwiched between two silicon dioxide layers. The non conducting dielectric layer traps electrical charge and the two layers of silicon dioxide act as electrical insulators. A conducting gate layer is placed over the upper silicon dioxide layer.

A novel aspect of the memory device is that while it is programmed in the conventional manner, using hot electron programming, it is read in a direction opposite that of programming. Each cell is programmed conventionally by applying programming voltages to the gate and the drain while the source is grounded. Hot electrons are accelerated sufficiently to be injected into a region of the trapping dielectric layer near the drain. The device, however, is read in the opposite direction from which it was written, meaning voltages are applied to the gate and the source while the drain is grounded.

Reading in the reverse direction is most effective when relatively low gate voltages are used. A benefit of utilizing relatively low gate voltages in combination with reading in the reverse direction is that the potential across the portion of the channel beneath the trapped charge region is significantly reduced. A relatively small programming region or charge trapping region is possible due to the lower channel potential. This permits much faster programming times because the effect of the charge trapped in the localized trapping region is amplified. Programming times are reduced while the delta in threshold voltage between the programmed versus unprogrammed states remain the same. Another major benefit is that the erase mechanism of the memory cell is greatly enhanced. The memory cell can be erased by applying suitable erase voltages to the gate and the drain so as to cause electrons to be removed from the charge trapping region of the nitride layer. Electrons move from the nitride through the bottom oxide layer to the drain. Another benefit includes reduced wearout from cycling thus increasing device longevity. An effect of reading in the reverse direction is that a such higher threshold voltage for the same amount of programming is possible. Thus, to achieve a sufficient delta in the threshold voltage between the programmed and unprogrammed states of the memory cell, a much smaller region of trapped charge is required when the cell is read in the reverse direction than when the cell is read in the forward direction.

The erase mechanism is enhanced when the charge trapping region is made as narrow as possible. Programming in the forward direction and reading in the reverse direction permit limiting the width of the charge trapping region to a narrow region near the drain. This allows for much more efficient erasing of the memory cell.

Further, utilizing a thinner silicon nitride charge trapping layer than that disclosed in the prior art helps to confine the charge trapping region to a laterally narrower region near the drain. Further, the thinner top and bottom oxide sandwiching the nitride layer helps in retention of the trapped charge.

In addition, unlike prior art floating gate flash EEPROM memory cells, the bottom and top oxide thickness can be scaled due to the deep trapping levels that function to increase the potential barrier for direct tunneling. Since the electron trapping levels are so deep, thinner bottom and top oxides can be used without compromising charge retention. Another benefit of localized charge trapping is that during erase, the region of the nitride away from the drain does not experience deep depletion since the erase occurs near the drain only. The final threshold of the cell after erasing is self limited by the device structure itself. This is in direct contrast to conventional single transistor floating gate flash memory cells which are plagued with deep depletion problems. To overcome these problems, manufacturers include complex circuitry to control the erase process in order to prevent or recover from deep depletion.

Another approach previously employed in the prior art to solve the deep depletion problem was to design the floating gate flash memory cell using a split gate design forming multiple transistors per cell. The split gate or double transistor constructions were necessary because the information carrying transistor, i.e., the floating gate transistor, potentially could be over-erased. An over-erase condition caused the threshold voltage of the cell to go too low. The second transistor, acting as a control transistor, prevented the floating gate transistor from being over-erased.

BRIEF DESCRIPTION OF THE DRAWINGS

The invention is herein described, by way of example only, with reference to the accompanying drawings, wherein.

DETAILED DESCRIPTION OF THE INVENTION

Figure 1:
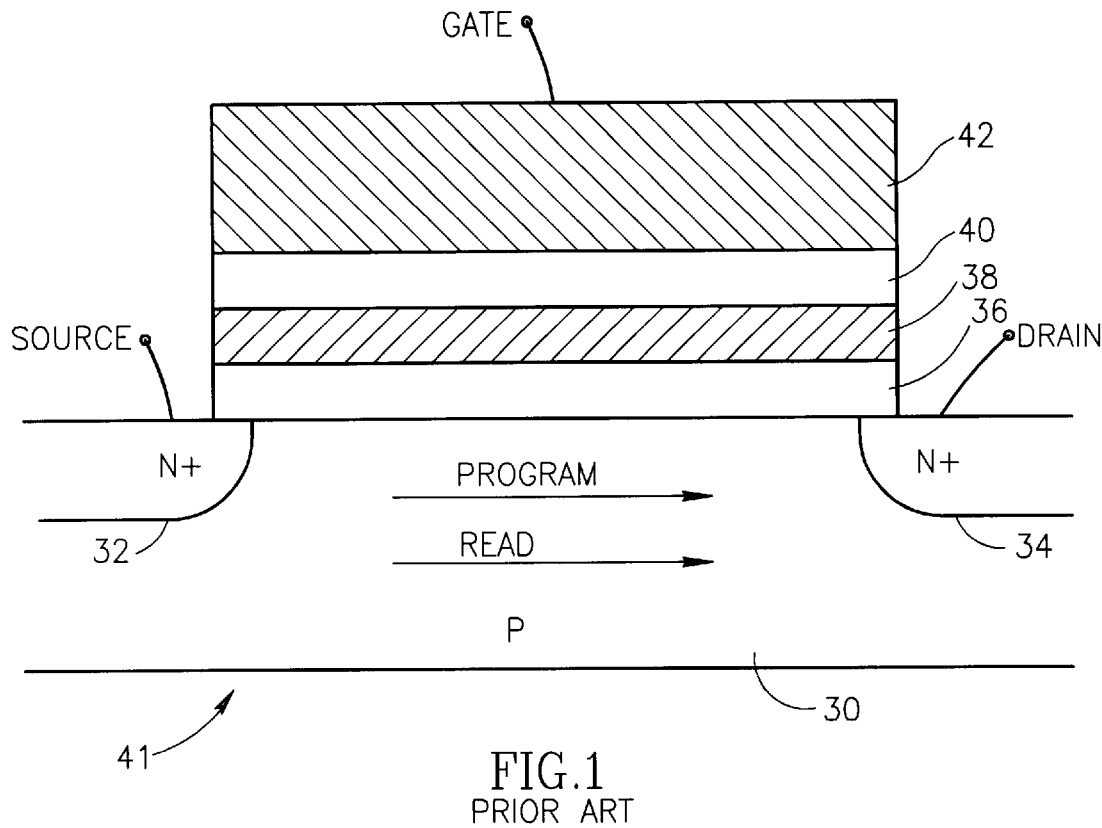
FIG. 1 illustrates a sectional view of a flash EEPROM cell of the prior art utilizing Oxide-Nitride-Oxide (ONO) as the gate dielectric.

The present invention can best be understood with an understanding of how prior art charge trapping dielectric flash EEPROM memory cells are constructed, programmed and read. Illustrated in FIG. 1 is a cross section of a conventional ONO EEPROM memory cell as disclosed in the technical article entitled "A True Single-Transistor Oxide-Nitride-Oxide EEPROM Device," T. Y. Chart, K. K. Young and Chenming Hu, IEEE Electron Device Letters, March 1987, incorporated herein by reference. The memory cell, generally referenced 41, comprises a P-type silicon substrate 30, two PN S junctions between N+ source and drain regions 32, 34 and P type substrate 30, a non conducting nitride layer 38 sandwiched between two oxide layers 36, 40 and a polycrystalline conducting layer 42.

Programming Prior Art Memory Devices

The operation of the prior art memory cell 41 will now be described. To program or write the cell, voltages are applied to the drain 34 and the gate 42 and the source 32 is grounded. For example, 10 V is applied to the gate and 9 V is applied to the drain.

These voltages generate a vertical and lateral electric field along the length of the channel from the source to the drain. This electric field causes electrons to be drawn off the source and begin accelerating towards the drain. As they move along the length of the channel, they gain energy. If they gain enough energy they are able to jump over the potential barrier of the oxide layer 36 into the silicon nitride layer 38 and become trapped. The probability of this occurring is a maximum in the region of the channel next to the drain 34 because it is near the drain that the electrons gain the most energy. These accelerated electrons are termed hot electrons and once injected into the nitride layer they become trapped and remain stored there. The trapped electrons cannot spread through the nitride layer because of the low conductivity of the nitride layer and the low lateral electric field in the nitride. Thus, the trapped charge remains in a localized trapping region in the nitride typically located close to the drain.

In U.S. Pat. No. 4,173,766, issued to Hayes, the nitride layer is described as typically being about 350 Angstroms thick (see column 6, lines 59 to 61). Further, the nitride layer in Hayes has no top oxide layer. A top oxide layer would serve as a low conductivity layer to prevent holes from moving into the nitride from the overlying gate and combining with electrons trapped in the nitride which reduces the charge stored in the nitride. If the memory cell of Hayes used a thinner nitride layer, then electrons trapped in the nitride layer would be lost to holes entering from the overlying conductive gate. The conductive gate permits the electrons in the nitride to be removed. Further, once the electrons are trapped in a given region of the nitride associated with a single cell, the programming of adjacent cells can cause an electric field to be generated with respect to the electrons in the trapped region of the single cell causing further dissipation of the electrons from the trapped region. During life testing, where the device is subjected to elevated temperatures typically in the range from about 150 degrees Centigrade to 250 degrees Centigrade, holes from the gate can enter the nitride and combine with the electrons to further reduce the amount of charge trapped in the nitride. Although lateral fields exist in the nitride of the Hayes structure as they do in any ONO structure used as gate insulation in an MOS device, the relatively thick nitride layer such as disclosed by Hayes causes the electrons to move laterally in response to this lateral field and come to rest either in traps between the conduction and valence bands or in localized regions of positive charge in the nitride layer. Such movement of electrons, commonly known as electron hopping, can readily occur in a relatively thick nitride layer such as disclosed by Hayes. Such hopping diffuses and thus reduces the localized intensity of the trapped charge.

As previously described, in order to achieve an effective delta in threshold voltage between the unprogrammed and the programmed state of each cell, the charge trapping region of prior art flash EEPROM cells must be made fairly wide. Thus, electrons are trapped in areas far from the drain which directly affects the effectiveness of the erase. In some cases, the device cannot be erased at all because the charge trapping region was programmed too wide.

In memory cells constructed using a conductive floating gate, the charge that gets injected into the gate is distributed equally across the entire gate. The threshold voltage of the entire gate increases as more and more charge is injected into the gate because the electrons that lodge in the gate screen the gate voltage from the channel.

With reference to FIG. 1, in devices with low conductivity or non conductive floating gates, the injection of hot electrons into the silicon nitride layer causes the gate threshold voltage to increase only in the localized trapping region. This is in contrast to the conductive floating gate memory cells of EPROMs and EEPROMs wherein the gate threshold voltage of the entire channel rises as programming time increases. In both conductive floating gate memory cell designs, an increase in the gate threshold voltage causes the current flowing through the channel to decrease for a given gate voltage. This reduces programming efficiency by lengthening the programming time. However, due to the localized electron trapping in the non conductive floating gate memory cell design, the programming time is reduced less than with the conductive floating gate memory cell design. The technique of programming flash EEPROM memory cells with either conductive or low conductivity or non conductive floating gates is well known in the art and is currently used to program EEPROM and flash EEPROM memory cells.

Reading Prior Art Memory Drives

The method of reading prior art flash EEPROM memory cells will now be described. The conventional technique of reading both prior art conductive floating gate and non conductive localized trapping gate EEPROM or flash EEPROM memory is to apply read voltages to the gate and drain and to ground the source. This is similar to the method of programming with the difference being that lower level voltages are applied during reading than during programming. Since the floating gate is conductive, the trapped charge is distributed evenly throughout the entire floating conductor. In a programmed device, the threshold is therefore high for the entire channel and the process of reading becomes symmetrical. It makes no difference whether voltage is applied to the drain and the source is grounded or vice versa. A similar process is also used to read prior art non conductive localized gate flash EEPROM devices.

The process of programming typically includes writing followed by reading. This is true for all EPROM and EEPROM memory devices. A short programming pulse is applied to the device followed by a read. The read is actually used to effectively measure the gate threshold voltage. By convention, the gate threshold voltage is measured by applying a voltage to the drain and a separate voltage to the gate, with the voltage on the gate being increased from zero while the channel current flowing from drain to source is measured. The gate voltage that provides 1 $\mu$A of channel current is termed the threshold voltage.

Typically, programming pulses (i.e., write pulses) are followed by read cycles 1 $\mu$A wherein the read is performed in the same direction that the programming pulse is applied. This is termed symmetrical programming and reading. Programming stops when the gate threshold voltage has reached a certain predetermined point (i.e., the channel current is reduced to a sufficiently low level). This point is chosen to ensure that a '0' bit can be distinguished from a '1' bit and that a certain data retention time has been achieved.

The Memory Device of the Present Invention

Figure 2:
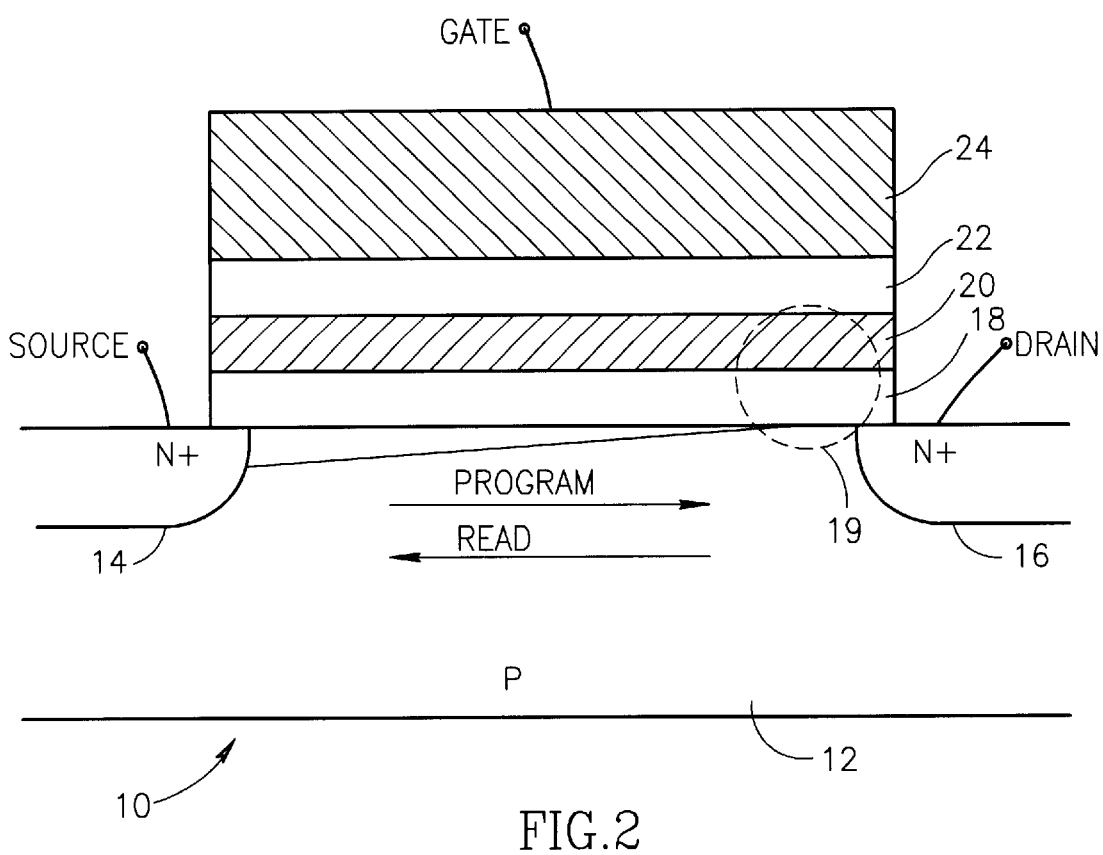
FIG. 2 illustrates a sectional view of a flash EEPROM cell in accordance with an embodiment of the present invention utilizing ONO as the gate dielectric.

A sectional view of a single bit flash EEPROM cell constructed in accordance with an embodiment of the present invention utilizing ONO as the gate dielectric is shown in FIG. 2. The flash EEPROM memory cell, generally referenced 10, comprises a P-type substrate 12 having two buried PN junctions, one being between the source 14 and substrate 12 and the other being between the drain 16 and the substrate 12. Above the channel is a layer of silicon dioxide 18, preferably between approximately 60 to 100 Angstroms thick, which forms an electric isolation layer over the channel. On top of the silicon dioxide layer 18 is a charge trapping layer 20 constructed preferably in the range of 20 to 100 Angstroms thick and preferably comprised of silicon nitride, $Si_3N_4$. The hot electrons are trapped as they are injected into the charge trapping layer. In this fashion, the charge trapping layer serves as the memory retention layer. Note that the programming, reading and erasing of the memory cell of the present invention is based on the movement of electrons as opposed to movement of holes. The charge trapping dielectric can be constructed using silicon nitride, silicon dioxide with buried polysilicon islands or implanted oxide, for example. In the third listed alternative, the oxide can be implanted with arsenic, for example. The thickness of layer 18 is chosen to be in excess of 50 Angstroms to prevent electrons from tunneling through the oxide and leaving charge trapping layer 20 during the operation of the cell. Thus, the lifetime of the cell of this invention is greatly extended relative to prior art MNOS devices.

Another layer of silicon dioxide 22 is formed over the charge trapping layer, (i.e., silicon nitride layer), and is preferably between approximately 60 to 100 Angstroms thick. The silicon dioxide layer 22 functions to electrically isolate a conductive gate 24 formed over the silicon dioxide layer 22. The thickness of gate 24 is approximately 4,000 Angstroms. Gate 24 can be constructed from polycrystalline silicon, commonly known as polysilicon.

Figure 3:
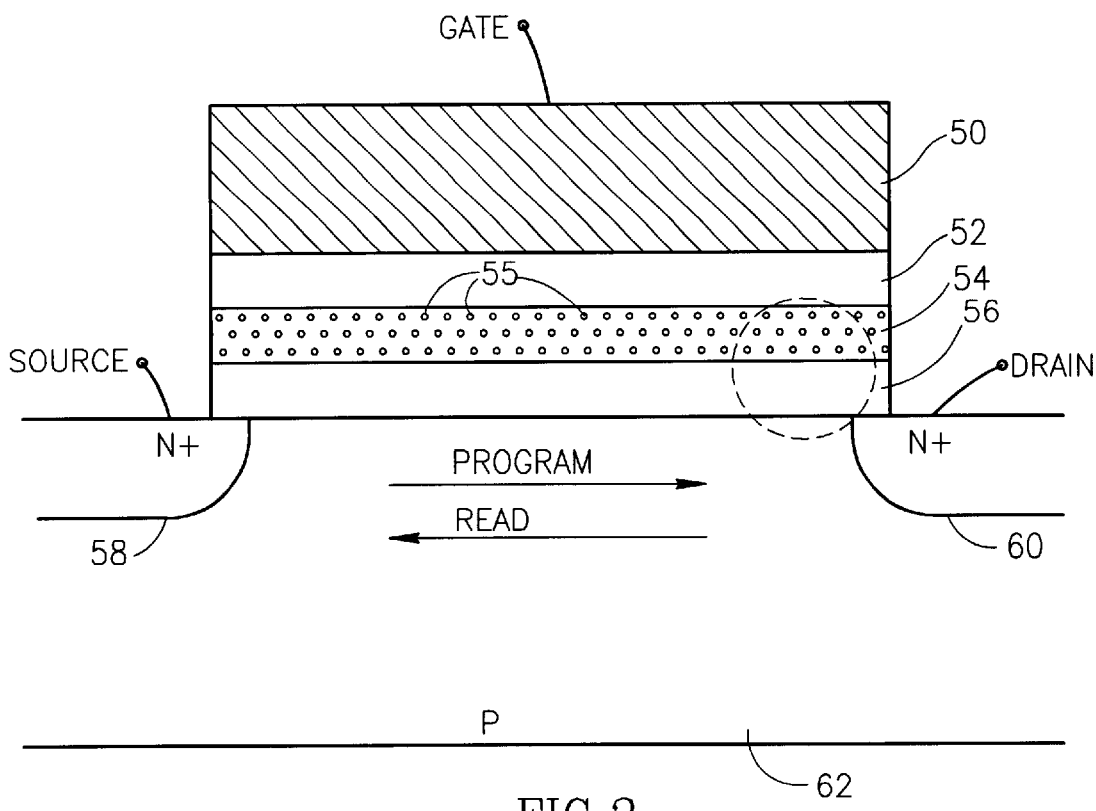
FIG. 3 illustrates a sectional view of a flash EEPROM cell in accordance with an embodiment of the present invention utilizing a silicon rich silicon dioxide with buried polysilicon islands as the gate dielectric.

Charge trapping dielectric materials other than nitride may also be suitable for use as the asymmetric charge trapping medium. One such material is silicon dioxide with buried polysilicon islands. The silicon dioxide with polysilicon islands is sandwiched between two layers of oxide in similar fashion to the construction of the ONO memory cell in FIG. 2. A sectional view of a flash EEPROM cell constructed in accordance with a preferred embodiment of the present invention utilizing a silicon rich silicon dioxide layer 54 with buried polysilicon islands 55 as the gate dielectric is illustrated in FIG. 3. Note that for simplicity, only a few polysilicon islands are numbered. A P-type substrate 62 has buried N+ source 58 and N+ drain 60 regions. The silicon dioxide 54 with buried polysilicon islands 55 is sandwiched between two layers of silicon dioxide 52, 56. Covering oxide layer 52 is polysilicon gate 50. Gate 50 is typically heavily doped with an N-type impurity such as phosphorus in the $10^{19}$ to $10^{20}$ atoms/cc range. The operation of the memory cell of FIG. 3 is similar to that of the memory cell illustrated in FIG. 2 with programming and reading occurring in opposite directions.

Alternatively, the charge trapping dielectric can be constructed by implanting an impurity, such as arsenic, into a middle layer 54 of silicon dioxide deposited on top of the bottom oxide 56.

A key aspect of the present invention lies in the manner in which the flash EEPROM memory cell 10 (FIG. 2) is programmed and read. Rather than performing symmetrical programming and reading, the flash EEPROM memory cell of the present invention is programmed and read asymmetrically. This means that programming and reading occur in opposite directions. The arrows labeled PROGRAM and READ in FIG. 2 point in opposite directions to signify this asymmetry. Thus, programming is performed in what is termed the forward direction and reading is performed in what is termed the opposite or reverse direction.

It is noted that throughout the discussion of the EEPROM memory cell of the present invention presented below, the voltage levels discussed in connection therewith are assumed to be independent of the power supply voltage. Thus, the power supply voltages supplied to the chip embodying the EEPROM memory device may vary while the voltages applied to the gate, drain and source thereof will be supplied from regulated voltage sources.

Programming in the Forward Direction

As previously mentioned, the flash EEPROM memory cell 10 of FIG. 2 is programmed similarly to the prior art flash EEPROM memory cell of FIG. 1. Voltages are applied to the gate 24 and drain 16 creating vertical and lateral electrical fields which accelerate electrons from the source 14 along the length of the channel. As the electrons move along the channel some of them gain sufficient energy to jump over the potential barrier of the bottom silicon dioxide layer 18 and become trapped in the silicon nitride layer 20. The electron trapping occurs in a region near the drain indicated by the dashed circle 19 in FIG. 2. Electrons are trapped in the portion of nitride layer 20 near but above the drain region 16 because the electric fields are the strongest there. Thus, the electrons have a maximum probability of being sufficiently energized to jump the potential barrier of the silicon dioxide layer 18 and become trapped in the nitride layer 20 near the drain 16. The threshold voltage of the portion of the channel between the source 14 and drain 16 under the region of trapped charge increases as more electrons are injected into the nitride layer 20.

It is important to note that in order to be able to subsequently erase memory device 10 effectively, the programming time period must be limited. As the device continues to be programmed, the width of the charge trapping region increases. If programming continues past a certain point the charge trapping region becomes too wide whereby erasing is ineffective in removing trapped charge from the nitride layer 20.

However, by reading in the reverse direction, programming times can be shortened. This permits a much narrower charge trapping region. This in turn greatly increases the erase efficiency since fewer electrons need to be removed to erase the device. In addition, the trapped electrons are stored in a narrower region near the drain also improving the effectiveness of the erase.

Reading in the Forward Direction

If the flash EEPROM memory cell 10 is read using the conventional technique of reading in the same direction as programming, the time needed to program the device greatly increases to achieve the same threshold voltage. Reading in the same direction as programming means the device is programmed and read in the same forward direction. During reading, voltages having levels lower than the voltages applied during programming are applied to the gate and drain and the channel current is sensed. If device 10 is programmed (i.e., a logic '0') the channel current should be very low and if the device is not programmed (i.e., a logic '1') there should be significant channel current. Preferably, the in difference the channel current between the '0' and '1' logic states should be maximized in order to better distinguish between the '0' and '1' logic states.

Figure 4:
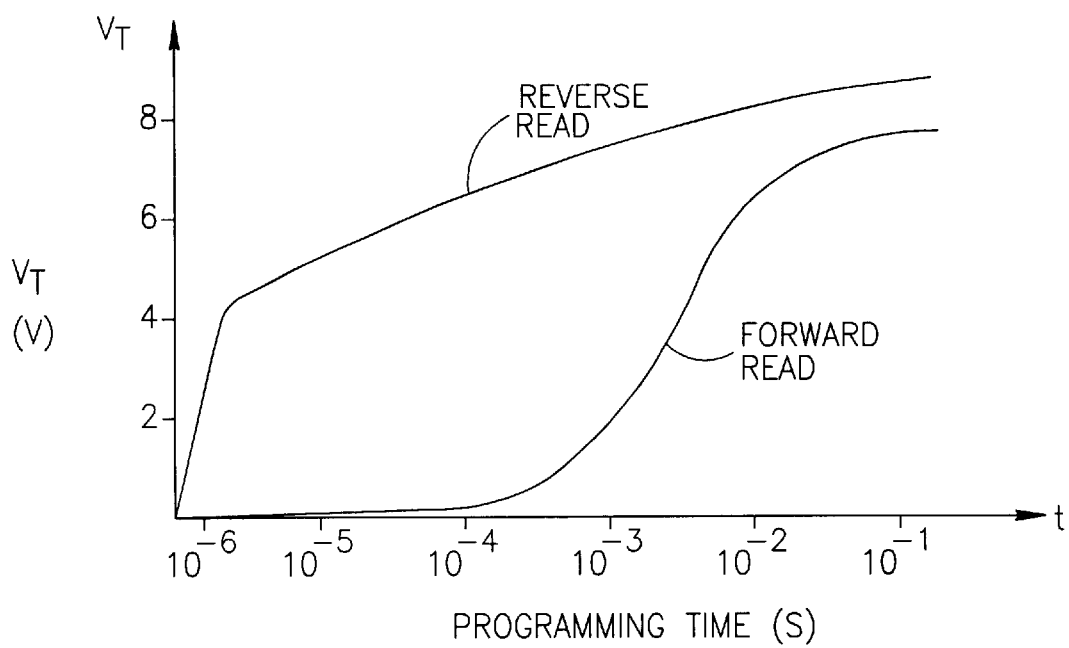
FIG. 4 is a chart illustrating the threshold voltage as a function of programming time for reading in the forward and reverse directions of a selected memory cell in accordance with this invention.

Illustrated in FIG. 4 is a graph showing the rise in gate threshold voltage as a function of programming time for reading in the forward direction (curve labeled FORWARD READ) and for reading in the reverse direction (curve labeled REVERSE READ). Apparent from the graph in FIG. 4 is the several orders of magnitude reduction in programming time achieved when reading in the reverse direction versus reading in the forward direction. As is described in more detail below, this dramatic reduction in programming time is due to amplification of the effect of the trapped charge injected into the nitride layer brought about by reading the memory cell in the opposite direction from which it was programmed.

Figure 5A:
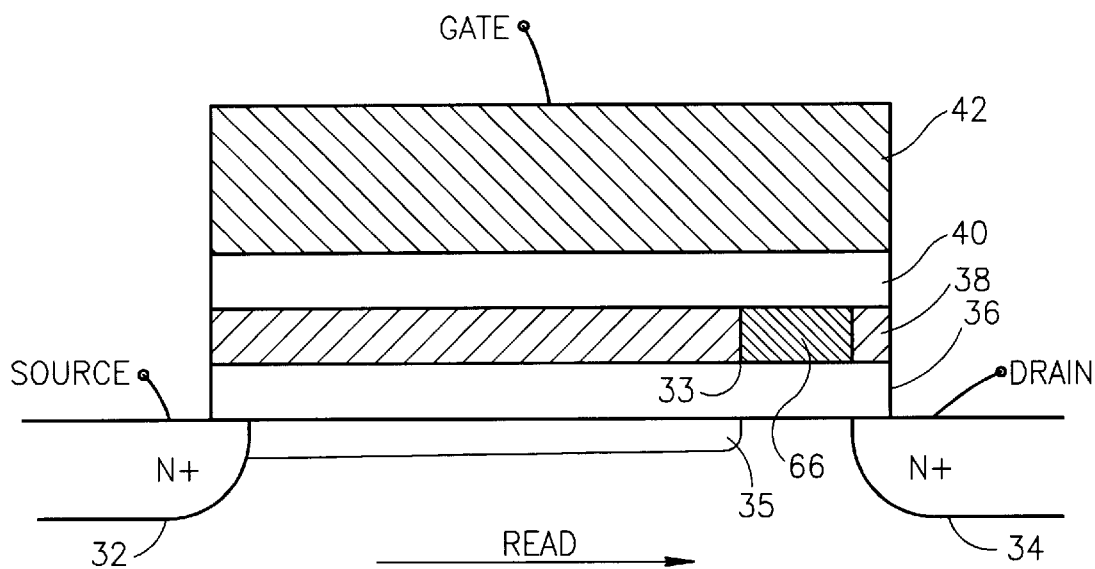
FIG. 5A illustrates a sectional view of a flash EEPROM cell of the prior art showing the area of charge trapping under the gate.
Figure 5B:
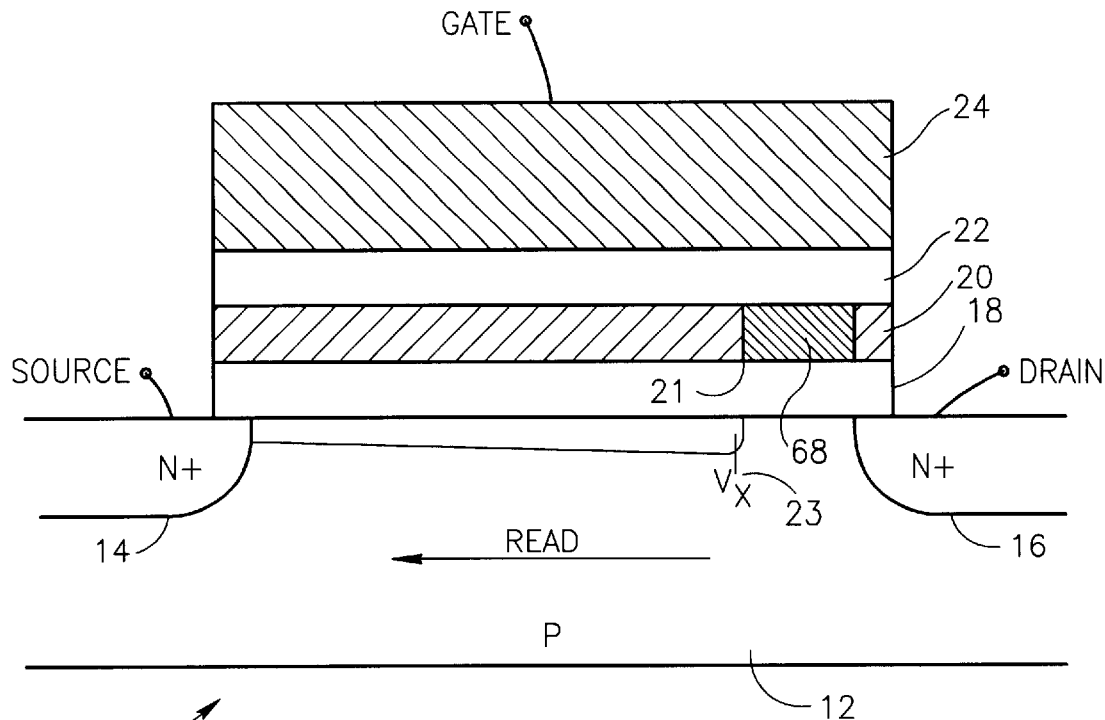
FIG. 5B illustrates the voltage in the channel beneath the gate relative to the trapped charge when the memory cell is read in the reverse direction.

As stated above, the time needed to program the flash EEPROM memory cell greatly increases when reading occurs in the same direction (i.e., the forward direction) as programming. The reason for this will now be explained in more detail with reference to FIGS. 5A and 5B. FIG. 5A illustrates a sectional view of a flash EEPROM cell of the prior art showing the area 66 of charge trapping under the gate 42. FIG. 5B illustrates a sectional view of a flash EEPROM cell constructed in accordance with an embodiment of the present invention showing the area 68 of charge trapping under the gate 24.

A description of what occurs during programming is presented first followed by what occurs during reading. Note that the description that follows also pertains to the memory cell of FIG. 3 comprising the silicon dioxide layer 54 having buried polysilicon islands 55 substituting for the nitride layer 20 of FIG. 2. During programming, hot electrons are injected into the nitride layer 20, as described above. Since nitride 20 is a nonconductor, the trapped charge remains localized to the region near the drain 34 (FIG. 5A) or 16 (FIG. 5B). The region of trapped charge is indicated by the cross hatched area 66 in FIG. 5A and by the cross hatched area 68 in FIG. 5B. Thus, the threshold voltage rises, for example, to approximately 4 V, only in the portion of the channel under the trapped charge. The threshold voltage of the remainder of the channel under the gate remains at, for example, approximately 1 V. If the device is now read in the conventional forward direction (i.e., voltages are applied to the gate and drain as indicated by the arrow in FIG. 5A), electrons move off the source and begin traveling toward the drain. When a logic '0' is programmed, there can be little or no channel current through the device when it is read. Thus, only if a sufficient portion of the channel is turned off, can the electron current be stopped. If the channel cannot be completely turned off, the electrons will reach the drain. Whether the electrons reach the drain will be determined by, among other things, the length of the trapping area. If the memory cell is programmed for a sufficiently long period, eventually, the channel stops conducting when read in the forward direction. If the trapped charge region (the programmed area) 66 (FIG. 5A) is not long enough, electrons can punch through to the drain 34 in the depletion region under the trapped charge 66.

When the device is read in the forward direction, a voltage is applied to the drain and the gate, for example 2 V and 3 V, respectively, and the source is grounded. Full inversion occurs in the channel under the area of the nitride 38 that does not have trapped charge. A vertical electric field exists in the channel that spans the length of the channel up to the region of the channel underneath the trapped charge 66. In the inversion region, electrons travel in a linear fashion up to the edge 35 of the inversion region which is beneath the left edge 33 of the trapped charge region 66. This is indicated by the line shown in the channel region in FIG. 5A that extends from the source to just beneath the edge 33 of the region of trapped charge 66. Due the fact that the device is in inversion (i.e., the channel is in a conductive state), the potential in the inversion layer is pinned to ground potential because the source is grounded. The voltage in the inverted channel near the trapped charge (i.e., just to the left of the right edge 35 of the channel inversion region) is approximately zero. Thus, the voltage across the region of trapped charge is close to the full drain potential of 2 V. Due to the drain potential across the channel region beneath the trapped charge 66 some of the electrons punch through across the trapped region to the drain, resulting in a channel current.

The diagonal line under the channel in FIGS. 2 and 5A indicates the reduction in the number of electrons in the channel as a function of channel distance. The channel region under the trapped charge is off (i.e., not inverted) due to the high threshold voltage required to invert this region under the trapped charge. However, the channel region inside the dashed circle 19 in FIG. 2 and under the region 66 in FIG. 5A is a depletion region because the device is in saturation (a device will be in saturation when $V_{DS}$, the voltage from drain to source, is higher than $V_{DSAT}$, the saturation voltage). Due to the voltage on the drain 34, a lateral electric field exists in this portion of the channel under region 66. As a result of this lateral electric field, any electron arriving at the edge of the depletion region will be swept through and pulled to the drain 34. As described earlier, this phenomenon is called punch through. Punch through occurs if the lateral electric field is strong enough to draw electrons through to the drain, regardless of the threshold level. In order to prevent punch through from occurring during a read, the prior art memory cells require a much longer programming time than does the memory cell of this invention because the prior art memory cells are read in the forward direction. As the memory device is programmed for a longer and longer time, more and more electrons are injected into the nitride, increasing the length of the programmed portion 66 (FIG. 5A) of the channel. The memory cell must be programmed for an amount of time that yields a trapped charge region 66 of sufficient length to eliminate the punch through of electrons. When this occurs, the lateral electric field is too weak for electrons to punch through .to the drain under normal operating conditions. As an example, for the threshold voltage $V_T$ equaling 3 V during read, FIG. 4 shows that a programming time of approximately 3 milliseconds is required.

Reading in the Reverse Direction

However, if the flash EEPROM memory cell 10 (FIG. 5B) is read in the reverse direction, a very different scenario exists. Reading in the reverse direction means reading in a direction opposite that of programming. In other words, voltages are applied to the source 14 and the gate 24 and the drain 16 is grounded. Similar to the prior art memory device of FIG. 5A, the memory device of FIG. 5B is programmed in the forward direction by injecting hot electrons into region 68 of the nitride layer 20. Since nitride 20 is a nonconductor, the trapped charge remains localized to the region 68 near the drain 16. The region 68 of trapped charge is indicated by the cross hatched area 68 in FIG. 5B. Thus, the threshold voltage rises, for example, to approximately 4 V only in the portion of the channel under the trapped charge 68. The threshold voltage of the remainder of the channel remains at, for example, approximately 1 V.

To read the device of FIG. 5B in the reverse direction, voltages are applied to the source 14 and the gate 24, for example 2 V and 3 V, respectively, and the drain 16 is grounded. A major difference between reading in the forward direction and reading in the reverse direction is that when reading in the reverse direction, the gate voltage required to put the channel of the memory device into inversion increases significantly. For the same applied gate voltage of 3 V, for example, there will be no inversion but rather the channel of the memory device will be in depletion. The reason for this is that the channel region next to the drain 16 (which functions as the source in read) is not inverted due to the electron charge in region 68 of the nitride 20. The channel adjacent the source 14 (which functions as the drain in read) is not inverted because 2 V is applied to the source 14 and the channel, to be inverted, must be inverted relative to 2 V.

In the case of reading in the reverse direction, in order to sustain a higher voltage in the channel, a much wider depletion region must be sustained. A wider depletion region translates to more fixed charge that must be compensated for before there can be inversion. When reading in the reverse direction in accordance with the present invention, to achieve a voltage drop across the charge trapping region 66 of the prior art memory device shown in FIG. 5A similar to the voltage drop achieved when reading the same device in the forward direction, a higher gate voltage is required, for example, 4 V. This is in contrast to the prior art memory device where the source was grounded and a lower gate voltage was required to invert the channel. In the memory device of the present invention, a much higher gate voltage is required to pin the voltage in the channel to a higher voltage, i.e., the 2 V that is applied to the source terminal rather than ground. In other words, the present invention recognizes and takes advantage of the fact that for the same magnitude potential across the drain and the source, the voltage across the portion of the channel under the trapped charge region 68 (FIG. 5B) is significantly reduced when reading occurs in a reverse direction to writing (programming) directly resulting in less punch through and greater impact of the programming charge injected in region 68 of the nitride layer 20 (FIG. 5B) on, the threshold voltage of the transistor. As an example, for the threshold voltage $V_T$ 3 V during reverse read, FIG. 4 shows that a programming time of approximately 2 microseconds is required. This programming time is three orders of magnitude less than the programming time required for the same threshold voltage when the cell is read in the forward direction.

In the prior art, memory cells utilizing the ONO structure have had difficulty retaining the localized charge in the nitride layer. This is because such memory cells are programmed in a first, forward, direction and then read in the same direction. The reading of the programmed cell in the forward direction requires a significant amount of charge to be stored on the nitride to provide the desired increase in threshold voltage associated with the programmed cell. However, in accordance with this invention, by reading in the reverse direction, significantly less charge is required to be stored on the nitride to achieve the same increase in threshold voltage in a programmed cell. FIG. 4 shows the difference in charge (measured as a function of programming time required to achieve a given threshold voltage $V_T$) for reading in the reverse direction versus the forward direction. In the prior art, the charge retention in a localized region of the silicon nitride layer was difficult if not impossible to achieve because the lateral electric field generated by the charge dispersed the charge laterally in the nitride layer. Such dispersion particularly occurred during the high temperature retention bake required for quality control and reliability. The high temperature retention bake typically requires temperatures between 150 degrees Centigrade to 250 degrees Centigrade for at least 12 to 24 hours. The charge in the prior art devices typically dispersed through the nitride during the high temperature bake causing the performance of prior art devices using the nitride layer as a charge retention material to be less than satisfactory. Accordingly, prior art devices that use the nitride layer for charge retention are not widely used. In addition, charge stored on the nitride layer in prior art memory cells is particularly prone to lateral diffusion and dispersion through the nitride layer in response to the retention bake due to the internal fields causing what is known as electron hopping. The phenomenon of electron hopping is exponentially dependent on the field strength. In the case of charge in the nitride layer the internally generated electric field strength is directly related to the amount of charge stored on the nitride layer. Because electron hopping is exponentially dependent upon the electric field strength, the additional charge required to obtain a given threshold voltage change or shift when the memory cell is read in the same direction as it was programmed causes a very significant change in the charge distribution in the nitride layer. This change in the charge distribution seriously degrades the threshold voltage from the intended (i.e., design) threshold voltage. Consequently, prior art ONO devices have not been successful.

In accordance with the present invention, by reading the memory cell in the reverse direction from which the memory cell is programmed, the amount of charge required to achieve a given threshold voltage is reduced in some cases by a factor of two or three times the amount of charge required to obtain the same threshold voltage shift as when the memory cell is read in the forward direction. Accordingly, the internal electric fields generated by the charge in the nitride when the memory cell is to be read in the reverse direction are much less than the internal electric fields associated with the charge stored on the nitride when the memory cell is to be read in the forward direction. Consequently electron hopping is exponentially reduced and the small amount of charge stored in the nitride does not disperse laterally through the nitride due to the internally self generated electric fields even during retention bake. Consequently, the memory cell of the present invention does not suffer the degradation in performance and reliability of prior art ONO memory cells which are programmed and read in the same direction.

Sample Flash EEPROM Device Data

Figure 6:
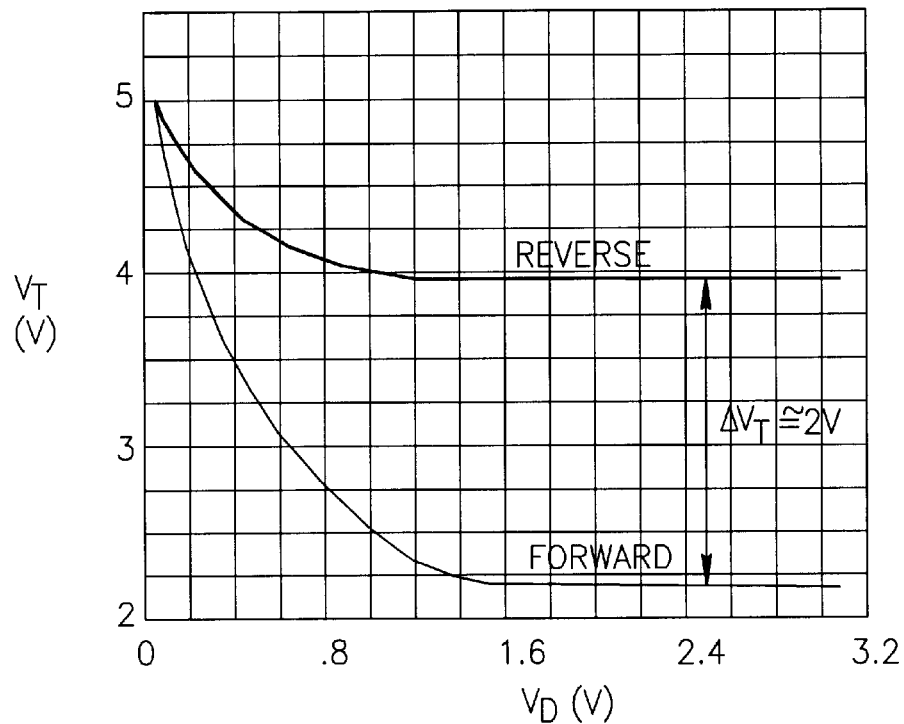
FIG. 6 is a graph illustrating the difference in threshold voltage in the forward and reverse directions as a function of drain voltage for a flash EEPROM cell of the present invention that has been programmed.

Data obtained from flash EEPROM devices constructed in accordance with the present invention will now be presented to help illustrate the principles of operation thereof. A graph illustrating the difference in threshold voltage in the forward and reverse directions as a function of drain voltage for a flash EEPROM cell of the present invention that has been previously programmed is shown in FIG. 6. The memory cell used to obtain the data presented in FIGS. 6, 7 and 8 was constructed with a bottom oxide layer 18, a top oxide 22 and a nitride layer 20, each 100 Angstroms thick. The drawn width of the channel measures 0.6 microns and the drawn length of the channel measures 0.65 microns.

While reading in the forward direction, the threshold voltage is approximately the same as the threshold voltage when reading in the reverse direction for low drain voltages. At low drain voltages there is insufficient potential for punch through to occur. However, as the drain voltage increases while reading in the forward direction, the punch through region increases resulting in lower threshold voltage. At a high enough drain voltage, the entire portion of the channel under the trapped charge in region 68 of nitride layer 20 (FIG. 5B) is punched through and the threshold voltage levels off at the original threshold voltage of the channel.

However, while reading in the reverse direction, the $V_T$ versus $V_D$ curve appears to follow the $V_T$ versus $V_D$ curve while reading in the forward direction at low drain voltages. However, the curves rapidly diverge for higher drain voltages and the threshold voltage for reading in the reverse direction levels off at approximately 4 V. At a gate voltage $V_G$ of approximately 4 V and a drain voltage $V_D$ of 1.2 V, the device has reached saturation ($V_{DSAT}$). At this gate voltage, any further increase in $V_D$ cannot be transferred through the inversion layer thus establishing the maximum potential drop across the portion of the channel beneath the charge trapping region 68. The $V_T$ then becomes independent of further increases in $V_D$. For example, at a drain voltage of 1.6 V, the difference in $V_T$ between reverse and forward read is almost 2 V.

Figure 7:
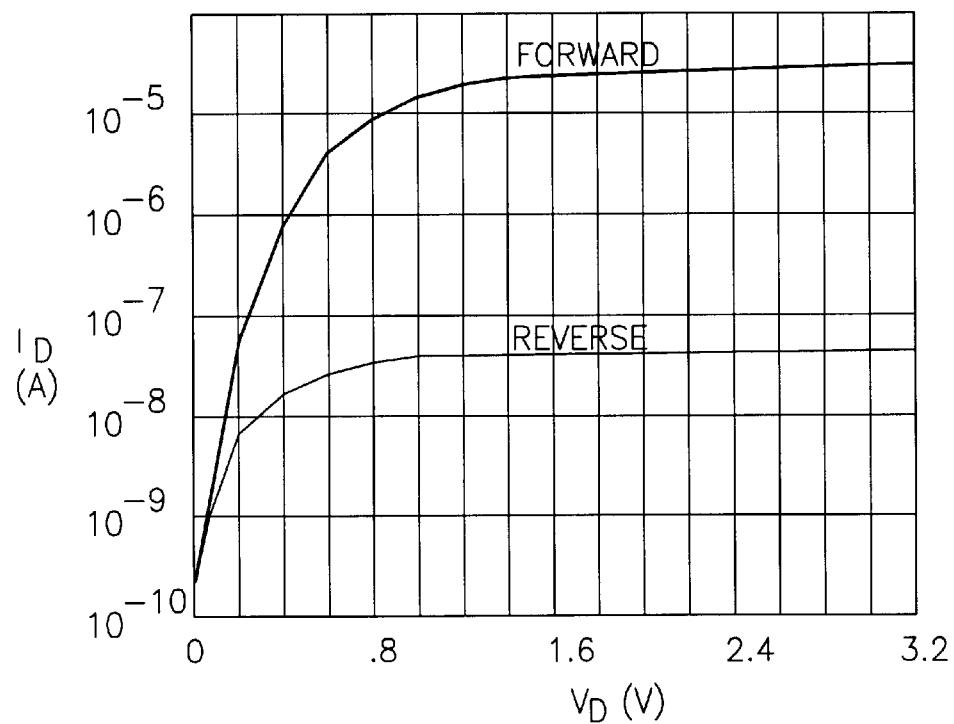
FIG. 7 is a graph illustrating the difference in drain current in the forward and reverse directions as a function of drain voltage for a flash EEPROM cell of the present invention that has been programmed.

A graph illustrating the difference in drain current in the forward and reverse directions as a function of drain voltage for a flash EEPROM cell of the present invention that has been programmed is shown in FIG. 7. In FIG. 7, rather than measure threshold voltage, the drain current is measured while keeping the gate voltage constant. In the forward direction, as expected, the drain current $I_D$ increases as the drain voltage $V_D$ increases. The curve labeled FORWARD also resembles the $I_D$ curve for reading an unprogrammed cell in the reverse direction.

The drain current while reading in the reverse direction also increases with increasing drain voltage (measured at the source which functions as the drain when reading in the reverse direction) but the drain current levels off at a much lower current than when reading in the forward direction. The difference between drain current at a $V_D$ of 2 V is on the order of approximately 1000 times. If the logic threshold for this memory cell is set to 10 µA, the forward curve can represent a logic '0' and the reverse curve a logic '1'.

Figure 8:
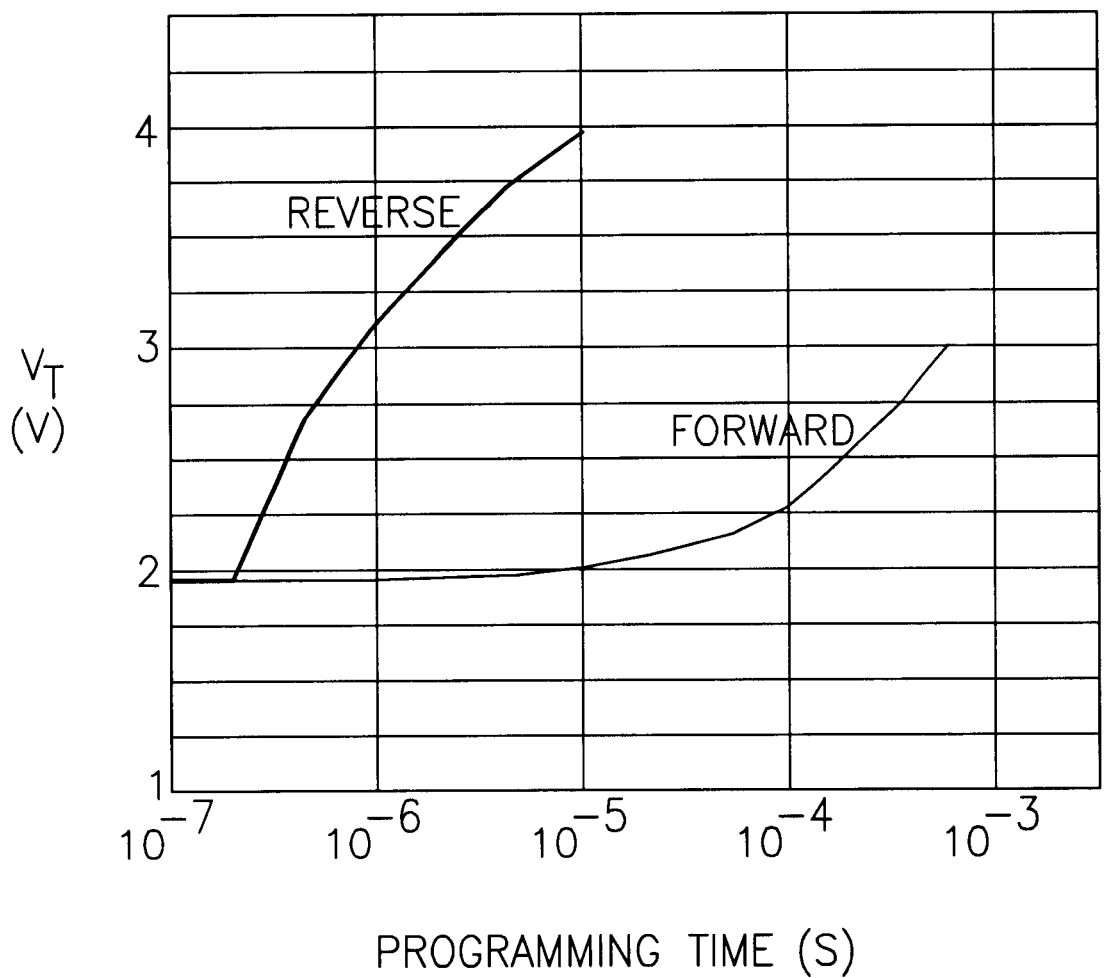
FIG. 8 is a graph illustrating the threshold voltage of a flash EEPROM cell of the present invention as a function of programming time for reading in the forward and reverse directions.

A graph illustrating the threshold voltage $V_T$ of a flash EEPROM cell of the present invention as a function of programming time for reading in the forward and reverse directions is shown in FIG. 8. This chart is similar to the chart of FIG. 4. Note that the chart of FIG. 8 is derived from a memory device actually constructed. During programming, $V_D$ is held constant at 5.5 V and $V_G$ is held constant at 10 V. As shown in FIG. 8, when the cell is read in the reverse direction, $V_T$ reaches 3 V in slightly under a microsecond of programming time. When the cell is read in the forward direction, the same $V_T$ is reached in slightly under a millisecond. Thus, reading in the forward direction, in this case, is approximately 1000 times less efficient than reading in the reverse direction.

The Voltage Vx in the Channel

The voltage $V_X$ is defined as the voltage in the channel at a distance X from the source. Using the example presented above, the voltage $V_X$ that exists in the channel of the memory cell of the present invention (FIG. 5B, for example) will not be 2V because the device is in depletion rather than inversion. On the other hand, the voltage $V_X$ must be larger than 0 because a gate voltage of only 1.5 V is able to sustain approximately 0.4 V in the channel. The actual voltage in the channel varies across the channel length because of the lateral electric field set up between the source and the drain. The threshold voltage, however, varies as a function of the voltage in the channel.

With reference to FIG. 5B, the channel will be in saturation as long as the gate voltage $V_G$ is higher than the threshold voltage $V_T$ and the voltage $V_X$ at any point in the channel is given by $$V_X = V_{DSAT}$$

with $$V_{DSAT} = V_G - V_T = V_G - V_T(V_{DSAT})$$

and $$V_T(V_X) = V_{TO} + \Delta_{VT}(V_X)$$

As is shown in the above equations, the threshold voltage in the channel is equal to the threshold voltage with the source at zero potential $V_{TO}$ plus a delta threshold voltage $\Delta V_T$ which is itself a function of the voltage in the channel.

Figure 9:
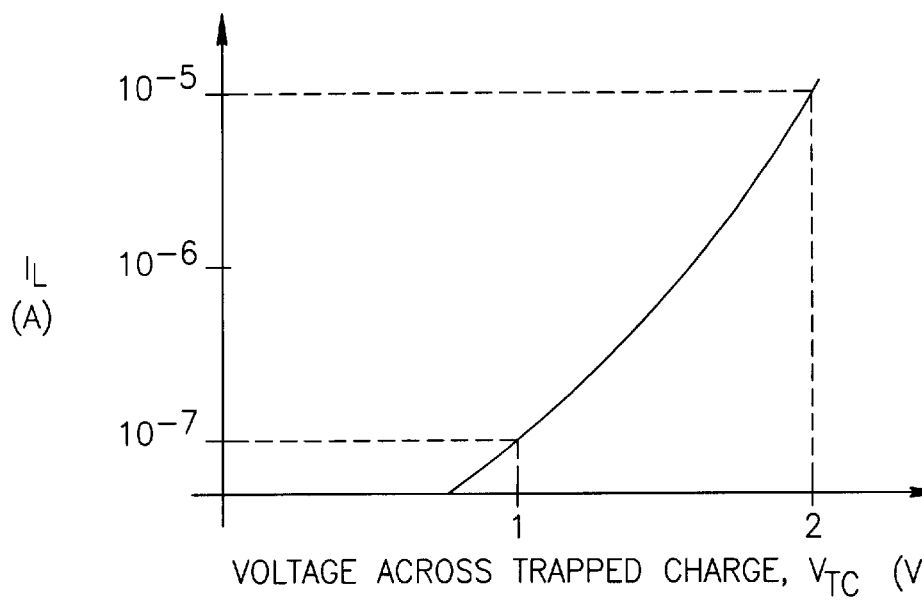
FIG. 9 is a graph illustrating the leakage current through the region of trapped charge as a function of the voltage across the charge trapping region while reading in the reverse direction.

The leakage current through the channel under the region 68 of trapped charge, plotted as a function of the voltage $V_{TC}$, across the portion of the channel under the charge trapping region 68 while reading in the reverse direction, is shown in FIG. 9. From the graph, one can see that the approximate leakage current $I_L$ through the channel when $V_{TC}$ is 2 V is $10^{-5}$ A. In the case of the prior art memory cell read in the forward direction, the voltage across the portion of the channel under region 68 of trapped charge is approximately 2 V. In contrast, the voltage $V_X$ in the channel of the memory device of the present invention at location 23 beneath the edge 21 of the region 68 of trapped charge is not 2 V but something less, 1 V for example. The leakage current IL corresponding to 1 V across the trapped charge region is approximately $10^{-7}$ A, a whole two orders of magnitude smaller.

Of importance, the edge of the region of trapped charge formed in the nitride layer during programming is the portion of the trapped charge that begins to affect the gate voltage required to invert the channel beneath that point.

Figure 10:
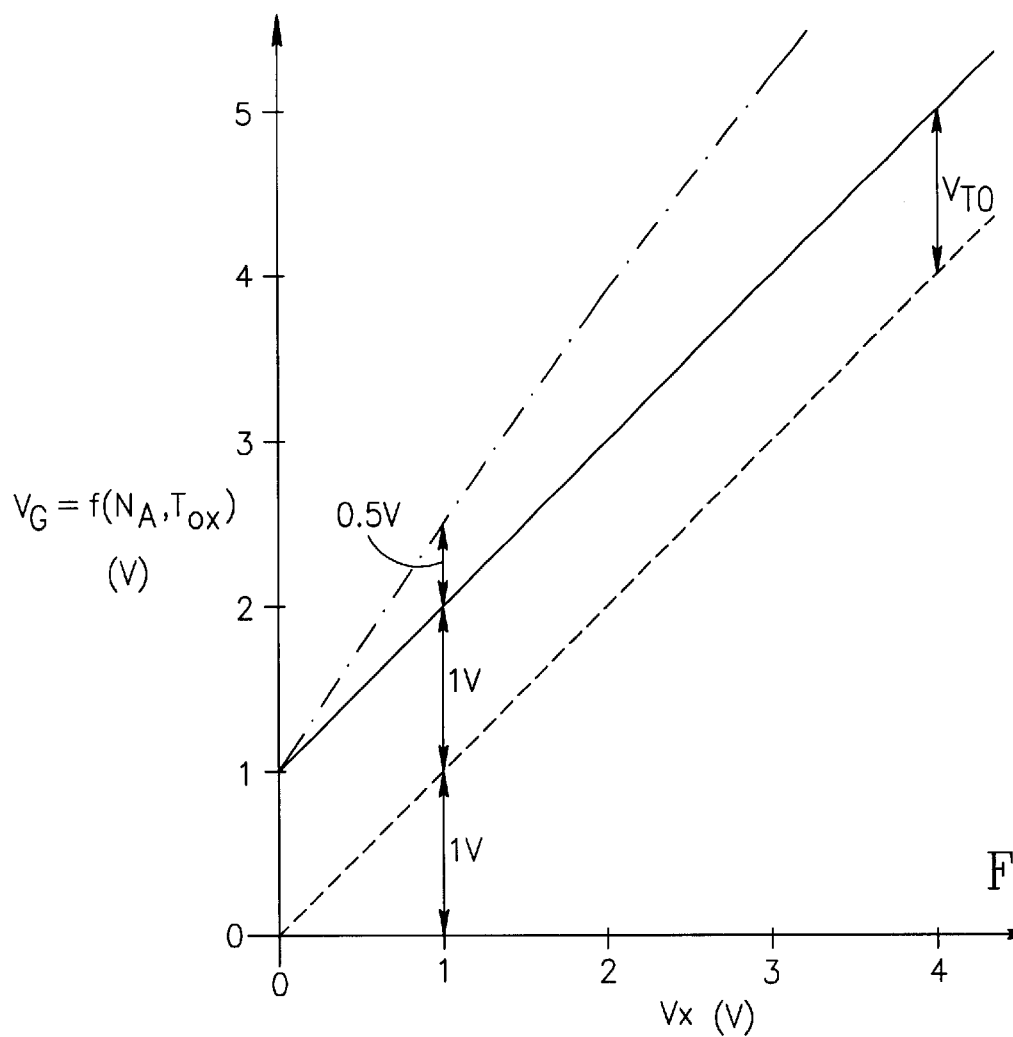
FIG. 10 is a graph illustrating the gate voltage required to sustain a given voltage $V_X$ in the channel beneath the edge of the region of trapped charge while reading in the reverse direction.

A graph illustrating the gate voltage required to sustain a given voltage in the channel, $V_X$, spanning the distance from the drain to the edge 23 of the channel under the edge 21 of the charge trapping area while reading in the reverse direction is shown in FIG. 10. The gate voltage $V_G$ that is required to sustain a particular $V_X$ at the point 23 in the channel under the edge 21 of the charge trapping area 68 (FIG. 5B) is a function of the number of acceptors $N_A$ in the substrate and the thickness of the oxide $T_{OX}$ and is represented by the dashed/dotted line. The solid line represents the threshold voltage in the channel that exists when the back bias effect on the threshold voltage is zero. In this case, the threshold voltage is constant along the entire channel. However, once there is a voltage in the channel, the threshold voltage is not constant along the channel. As shown in the graph, the threshold voltage increases nonlinearly as the voltage in the channel increases. The relationship between the incremental increase in threshold voltage as a function of channel voltage is well known in the art. A more detailed discussion of this relationship can be found in Chapter 2 of *The Design and Analysis of VLSI Circuits* by L. A. Glasser and D. W. Dobberpuhl, incorporated herein by reference.

Figure 11:
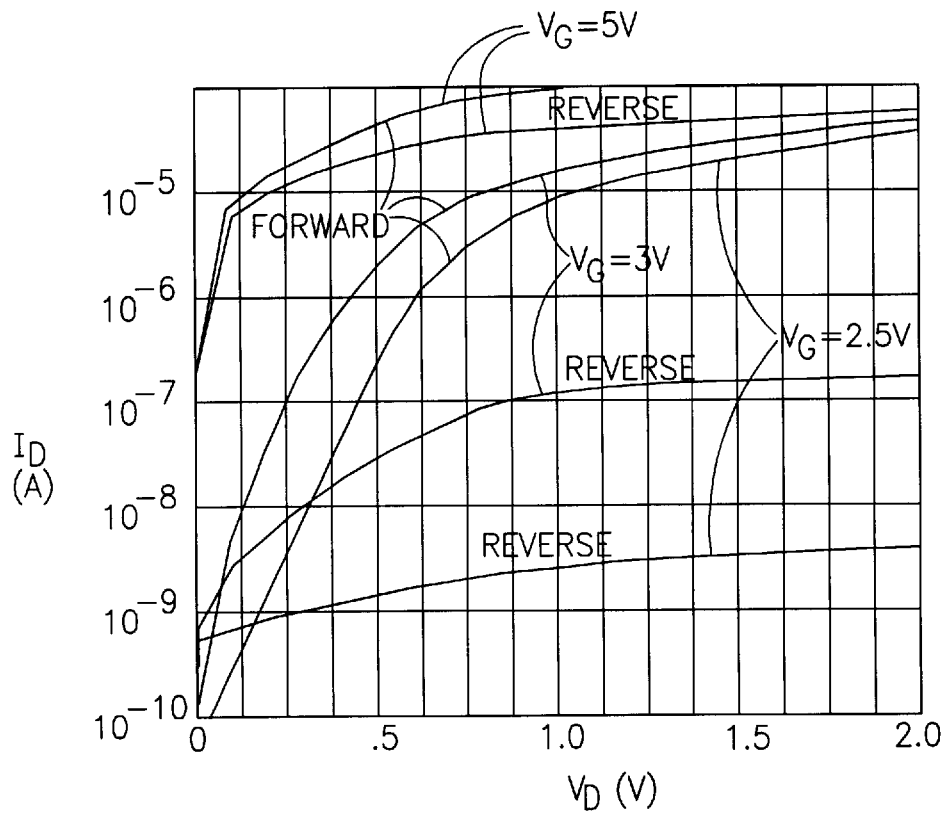
FIG. 11 is a graph illustrating the effect of the gate voltage applied during reading on the difference in drain current between reading in the forward versus the reverse direction.

It is important to emphasize that the advantages and benefits of reading in the reverse direction are achieved only when combined with the use of relatively low gate voltages. For a particular drain voltage, e.g., 2 V, applying a high enough $V_G$ such as 5 V, for example, causes the differences in threshold voltages between forward and reverse reading to fade. A graph illustrating the effect of the gate voltage $V_G$ applied during reading on the difference in drain current $I_D$ between reading in the forward direction versus reading in the reverse direction is shown in FIG. 11. The reverse $V_T$ of the device used to generate the curves in the Figure is 3.5 V. From FIG. 11 it can be seen that as $V_G$ is increased while $V_D$ is kept constant, the $I_D$ curves for the reverse read begin to resemble the curves for the forward read. For example, comparing the forward and reverse read curves when $V_G$ equals 2.5 V shows the read current in the reverse direction being about four orders of magnitude lower. At a gate voltage $V_G$ of 3 V, the difference in read current between the forward and reverse directions drops to a little more than two orders of magnitude. At a gate voltage of 5 V, the difference in read current is only approximately 15%. These curves clearly show that large differences in $I_D$ between the forward and reverse read directions are only obtained when $V_G$ is chosen to be low enough. Thus, the benefits of reading in the reverse direction are only achieved when suitably low gate voltages are used for reading. There is an optimum range within which $V_G$ should lie. If $V_G$ is too low, insufficient current is developed in the channel. On the other hand, if $V_G$ is chosen too high, the differences between reading in the reverse and forward directions are greatly diminished.

Figure 12:
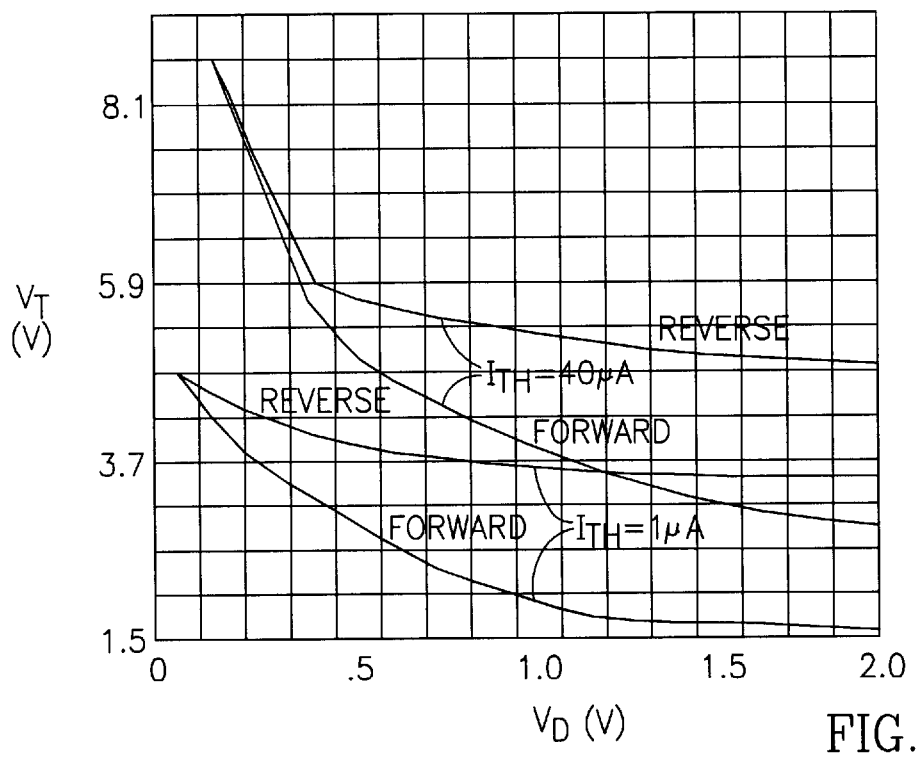
FIG. 12 is a graph illustrating the effects of the gate voltage on the difference in threshold voltage between the forward read and reverse read directions.

A graph illustrating the effect of the gate voltage on the difference in threshold voltage between the forward and reverse directions is shown in FIG. 12. The device used to generate the curves in FIG. 12 was programmed once to a $V_T$ of 3.5 V using a $V_D$ of 1.6 V and an $I_{TH}$ of 1 µA. The $V_T$ as a function of $V_D$ during reading was subsequently measured. As labeled in FIG. 12, the $I_{TH}$ level for the lower two curves is 1 µA, and is 40 µA for the upper two curves. The effect of raising the $I_{TH}$, is to force the $V_T$ measurement to be at a higher $V_G$ level even though the amount of charge trapped in the silicon nitride layer is identical for all measurements. For the lower two curves ($I_{TH}$ of 1 µA) the forward and reverse threshold voltages start to separate from each other at a $V_D$ of approximately 50 mV while the $V_T$ for the reverse saturates at approximately 0.6 V. For the upper two curves ($I_{TH}$ of 40 µA) the forward and reverse threshold voltages start to separate from each other at a $V_D$ of approximately 0.35 V while the $V_T$ for the reverse saturates at approximately 1.35 V. Thus, these curves clearly show that the effect of the trapped charge depends heavily on the choice of $V_G$.

Erasing Prior Art Memory Devices

As discussed previously in connection with U.S. Pat. No. 4,173,766, issued to Hayes, a major disadvantage of the Hayes prior art insulated gate device is the difficulty in using the Hayes device to construct a flash EEPROM. A consequence of using an oxide-nitride structure as opposed to an oxide-nitride-oxide structure is that during programming the charge gets distributed across the entire nitride layer. The absence of the top oxide layer lowers the ability to control where the charge is stored in the nitride layer and allows holes from the gate to neutralize charge in the nitride layer. A thick nitride layer is required in order to generate sufficient charge retention in the device. However, the relatively thick nitride layer causes the charge trapping region to be very wide thus making erasing the cell difficult if not impossible. Thus there is a tradeoff between charge retention and sufficiently large threshold voltage deltas on the one hand and the ability to erase the device on the other hand.

Some of the prior art devices that use hot electron programming utilize an erase mechanism whereby the electrons previously trapped in the nitride are neutralized (i.e., erased) by transferring holes into the nitride. The information is erased by grounding the gate and applying a sufficient potential to the drain to cause avalanche breakdown. Avalanche breakdown involves hot hole injection and requires relatively high voltages on the drain for the phenomenon to occur. The hot holes are generated and caused to jump over the hole potential barrier of the bottom oxide between the channel and the nitride and recombine with the electrons in the nitride. This mechanism, however, is very complex and it is difficult to construct memory devices that work in this manner. Another disadvantage of using hot hole injection for erasing is that since the drain/substrate junction is in breakdown, very large currents are generated that are difficult to control. Further, the number of program/erase cycles that the memory cell can sustain is limited because the breakdown damages the junction area. The damage is caused by very high local temperatures generated in the vicinity of the junction when it is in breakdown.

Erasing the Memory Device of the Present Invention

The erase mechanism of the flash EEPROM memory cell 10 (FIG. 5B) will now be described in more detail. The mechanism used to erase the flash EEPROM memory cell of the present invention involves the movement of electrons as opposed to the movement of holes. An erase is performed by removing electrons from the charge trapping nitride region 68 either is through the gate 24 via the top oxide 22 or through the drain 16 via the bottom oxide 18.

One technique is to simultaneously apply a negative potential to the gate 24 and a positive potential to the drain 16 such that electron tunneling occurs from the charge trapping nitride layer 20 to the drain 16 via the bottom oxide 18. The electron tunneling is substantially confined to a local area near the drain 16. To facilitate the erasing of the memory cell 10 using this technique, the thickness of the bottom oxide layer 18 is suitably constructed (i.e., has a thickness of about seventy (70) Angstroms) to optimize the removal of electrons from the nitride charge trapping layer 20 into the drain 16.

A second well known technique is to simultaneously apply a positive voltage potential to the gate 24 and zero potential, i.e., ground, to the drain 16 such that electron tunneling occurs from the charge trapping nitride layer 20 through the top oxide 22 to the gate 24. In this case, the thickness of the top oxide 22 is suitably constructed to optimize the tunneling of electrons from the nitride charge trapping layer 20 into the gate 24 in order to facilitate the erasing of the memory cell 10. In one embodiment, the top oxide 22 has a thickness of 50 Angstroms to 80 Angstroms for a voltage on gate 24 of 10 to 18 volts.

Figure 13:
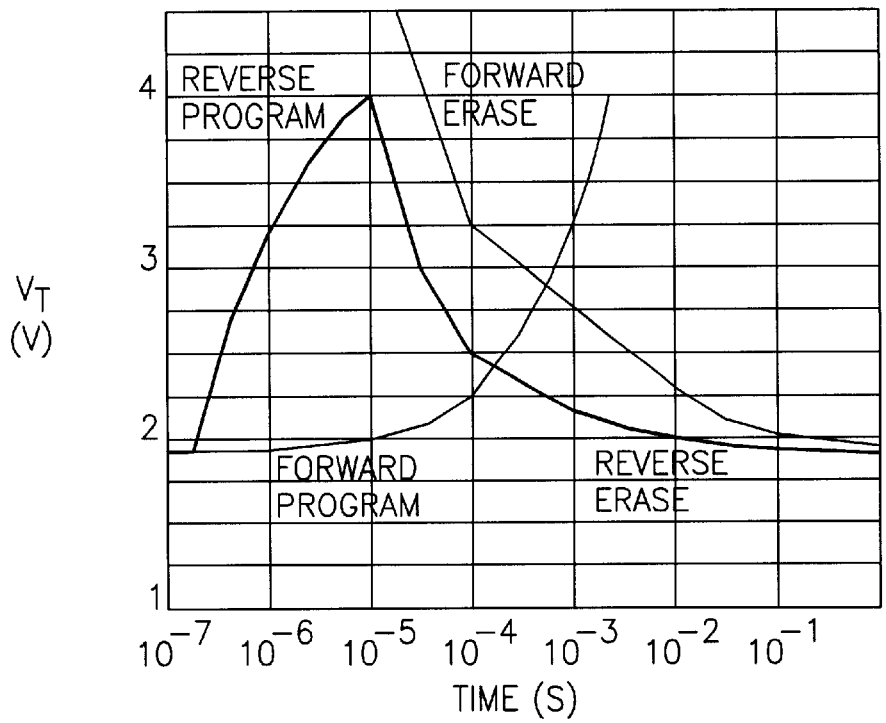
FIG. 13 is a graph illustrating the effect of programming time and erase time on the threshold voltage for the forward read and reverse read directions.

A graph illustrating the effect of programming on erase for the forward and reverse directions is shown in FIG. 13. The graph presented in FIG. 13 is based on data obtained from a memory cell constructed in accordance with the present invention. The top oxide 22, bottom oxide 18 and nitride 20 layers are each 100 Angstroms thick. Programming for forward and reverse utilized a $V_D$ of 5.5 V and $V_G$ of 10 V. The forward and reverse programming curves are identical to those illustrated in the graph of FIG. 8. The erase curves for the trapped charge associated with forward read reverse read utilized a $V_D$ of 5.5 V and a $V_G$ of −8 V.

As can be seen from FIG. 13, the slopes of the forward and reverse erase curves are different. Reading in the reverse direction requires trapped charge so much smaller than does reading in the forward direction that the erase is approximately 10 to 20 times more effective. Also apparent from FIG. 13 is that the cell does not enter deep depletion. Even at the 1 second erase mark, the threshold voltage (about 2 v) is no lower than that of an unprogrammed cell. This is a huge advantage of the memory cell of the present invention over prior art memory cells especially floating gate cells where over erase can cause a failure of the memory array due to deep depletion of the charge on the floating gate.

The erase mechanism in the memory cell is self limiting due to the fact that as the memory cell is erased, more and more positive charge is stored in the trapping region 68 of the nitride layer thereby neutralizing the negative charge stored there while the remainder of the nitride layer 20 remains unaffected. Thus, the threshold voltage of the channel keeps dropping until it levels off at the threshold voltage of an unprogrammed memory cell which is the threshold voltage of the larger majority of the channel closer to the source. Over erasing the memory cell of the present invention only affects (i.e., lowers) the threshold voltage of the portion of the channel under the charge trapping region 68 which is a relatively narrow region while leaving the threshold voltage of the remainder of the channel at its normal value.

As explained previously, a result of reading in the reverse direction is that a narrower charge trapping region is required due to the higher efficiency of the reverse read. Since erasing is always performed through the drain 16, less charge needs to be moved off the charge trapping layer 20 and directed through the drain 16. Thus, reading the memory cell 10 in the reverse direction enables much faster erase times. This makes the entire erase process much easier than in the prior art memory device. In the prior art memory device (i.e., forward programming/forward read), the charge trapping region 66 (FIG. 5A) was much bigger and wider to achieve the desired change in threshold voltage, thus making the erase process more difficult. To erase the cell 41, a larger amount of charge spread out over a wider trapping region 66 must be directed through the drain 34. The danger with this lies in that if the charge trapping region 66 becomes too wide, the cell 41 may never be able to be completely erased. The charge trapping region 66 may become too wide if the device is overprogrammed which is a real possibility when programming and reading in the forward direction.

Figure 14:
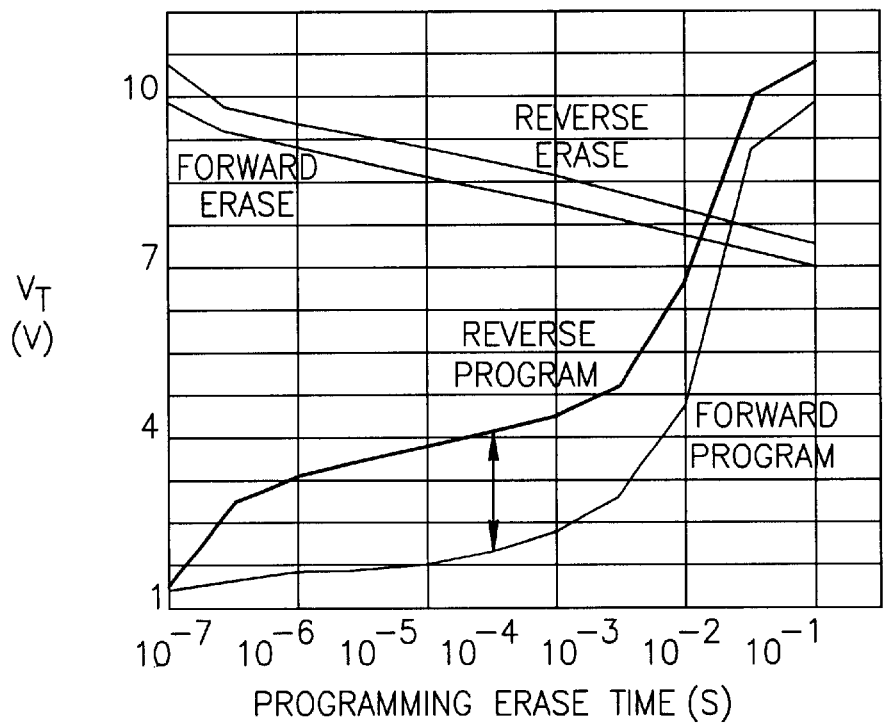
FIG. 14 is a graph illustrating the effect of over-programming on the ability to erase in the forward and reverse directions

A graph illustrating the effects associated with overprogramming on the ability to erase in the forward and reverse directions is shown in FIG. 14. The graph presented in FIG. 14 was constructed using data obtained from a memory cell 10 constructed in accordance with the present invention. The top oxide 22 (FIG. 5B), bottom oxide 18 and nitride layer 20 are each 100 Angstroms thick for a total ONO thickness of 300 Angstroms. Programming utilized a $V_D$ of 5.0 V and $V_G$ of 10 V. Erasing utilized a $V_D$ of 5.0 V and a $V_G$ of −8 V. Note that programming and erasing are both in the forward direction. Reading, however, is either in the forward or reverse direction. It is the reverse direction read in conjunction with the careful control of the gate voltage to be within a selected range, that yields the advantages of this invention.

In this case, the memory cell, which has been programmed for 100 milliseconds, does not fully erase in a reasonable time (shown in FIG. 14 as 100 milliseconds) with $V_T$ being approximately 7 V after 100 milliseconds of erase for reading in both the forward and reverse directions. The cell 10 cannot be erased because it has been over programmed, meaning the charge trapping region was made too wide to effectively erase. After 100 milliseconds of programming, the charge trapping region is very wide. The 13 V ($V_D$ of 5 V and $V_G$ of −8 v) that is applied across the charge trapping region 68 (FIG. 5B) to erase the trapped charge is effective in removing the electrons that are close to the drain 16. However, the electrons that are trapped further away from drain 16 towards the middle of the channel cannot be effectively removed because the electric field created by the 13 V potential difference between the drain and the gate is much weaker at that point.

As is apparent from FIGS. 13 and 14, the slopes of the forward and reverse program curves are different. After approximately one millisecond, the forward program curve exhibits a higher slope than the reverse program curve. This shows that reading in the reverse direction is more tolerant of over programming than reading in the forward direction in the sense that a given uncertainty in programming time causes a bigger uncertainty in threshold voltage $V_T$ when reading in the forward direction than when reading in the reverse direction. When reading in the reverse direction, a $V_T$ of about 4 V is reached after approximately 100 microseconds of programming. Even if programming continues up until a millisecond, a factor of 10x, the $V_T$ for reading in the reverse direction is only approximately 4.5 V. For reading in the forward direction, a $V_T$ of 4 V is reached only after approximately 7 milliseconds of programming. If programming is off by only 3x, the $V_T$ increases to approximately 8.3 V. At this high $V_T$, it is not likely that the device can be erased.

Thus, it is important to stress that reading the memory device in the reverse direction does not just enable simpler and faster erasing, but in fact, if the device is to be read in the forward direction and the trapped charge is so adjusted to give the desired threshold voltage $V_T$, erasing is likely to be not possible at all. This is because much more charge must be trapped on the dielectric 20 beneath the gate 24 to achieve a usable difference in threshold voltage $V_T$ between the programmed and the unprogrammed state than when reading in the reverse direction. This makes erasing the memory device at best difficult if not impossible thus making the forward programming/forward read impractical for this type of memory device which must be erasable.

The graph of FIG. 14 also emphasizes the higher effectiveness during erase of the voltage on the drain versus the gate. The gate voltage is not as effective due to the distance of the gate voltage from the trapped charge which includes the thicknesses of the top oxide 22 and the nitride layer 20. The drain voltage is more effective since it is more proximate to the region 68 of trapped charge. However, the gate voltage is more crucial when the width of the trapped charge region 68 is narrow. In this case, the gate voltage will be effective in creating an electric field that covers the entire charge trapping region 68 making the removal of electrons more efficient. The trapped charge region can only be made sufficiently narrow if the device is read in the reverse direction because only when the device is read in the reverse direction does a relatively small amount of charge stored on the dielectric under the gate yield a sufficiently larger difference in threshold voltage $V_T$ to allow the programmed state (i.e.,. charge stored on the gate) and the unprogrammed state (i.e., no charge stored on the gate) to be differentiated. As discussed previously, if the device is read in the forward direction, the charge trapping region must be made wide enough to generate a sufficient threshold voltage to differentiate between the programmed and the unprogrammed states.

Figure 15:
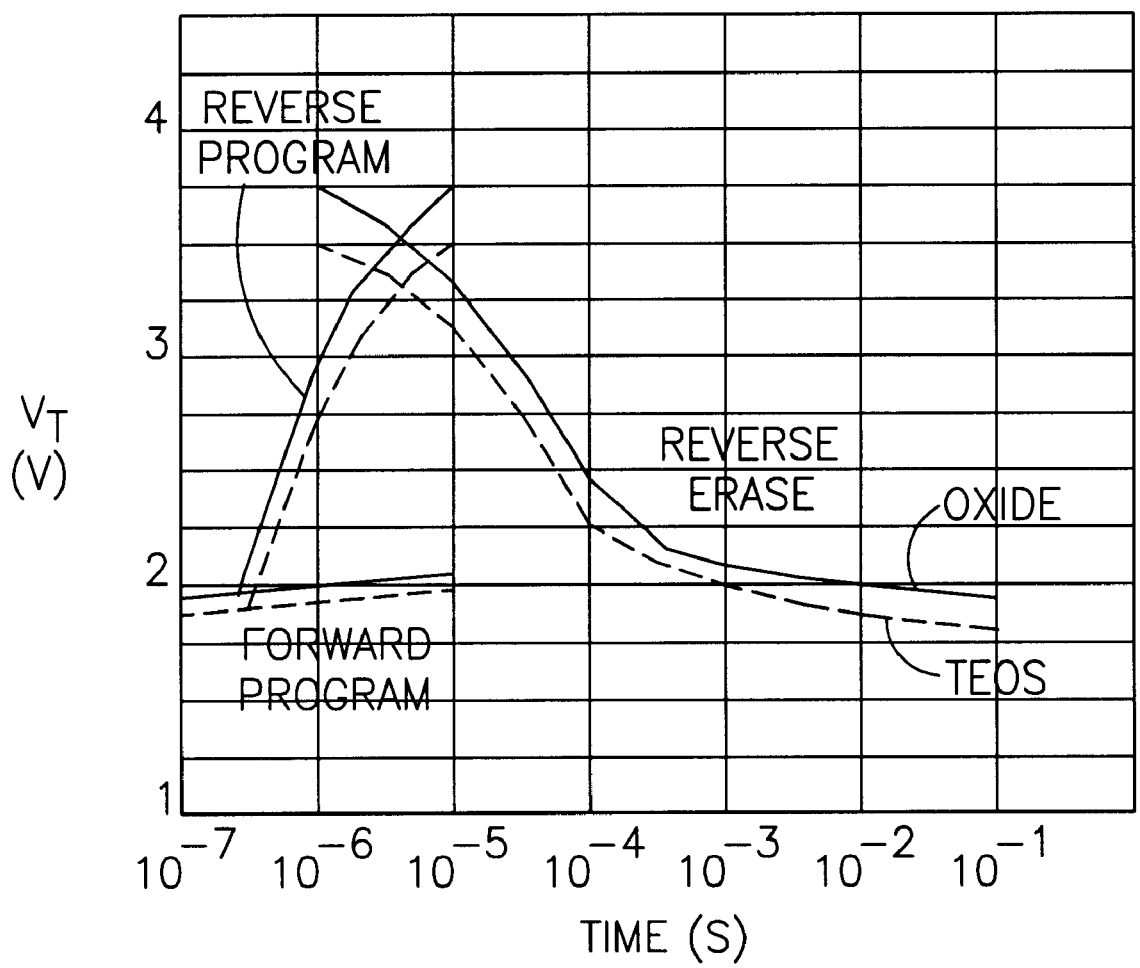
FIG. 15 is a graph illustrating the effect of oxide versus TEOS as the material used to form the silicon dioxide on top of the charge trapping layer of the structure of FIG. 2 on the programming and erasing of the charge placed on the charge trapping layer when the device is read in the reverse direction.

A graph illustrating the programming and erasing curves representing the use of oxide versus TEOS as the dielectric on top of the nitride is shown in FIG. 15. The chart presented in FIG. 15 was constructed using data obtained from two memory cells constructed in accordance with the present invention, one memory cell using TEOS to form the oxide on top of the nitride and the other memory cell using thermal oxidation of the nitride to form the top oxide layer. The top oxide, bottom oxide and nitride layers are 70, 100, and 80 Angstroms thick, respectively. The width/length ratio for each memory cell channel is 0.6/0.65 microns. Programming (which is always done in the forward direction) utilized a $V_D$ of 5.0 V and a $V_G$ of 10 V. Erasing (which is also always done in the forward direction) utilized a $V_D$ of 5.0 V and a $V_G$ of −6 V. This chart shows that there is little difference in the programming and erase characteristics when either oxide or TEOS is placed on top of the nitride.

Figure 16:
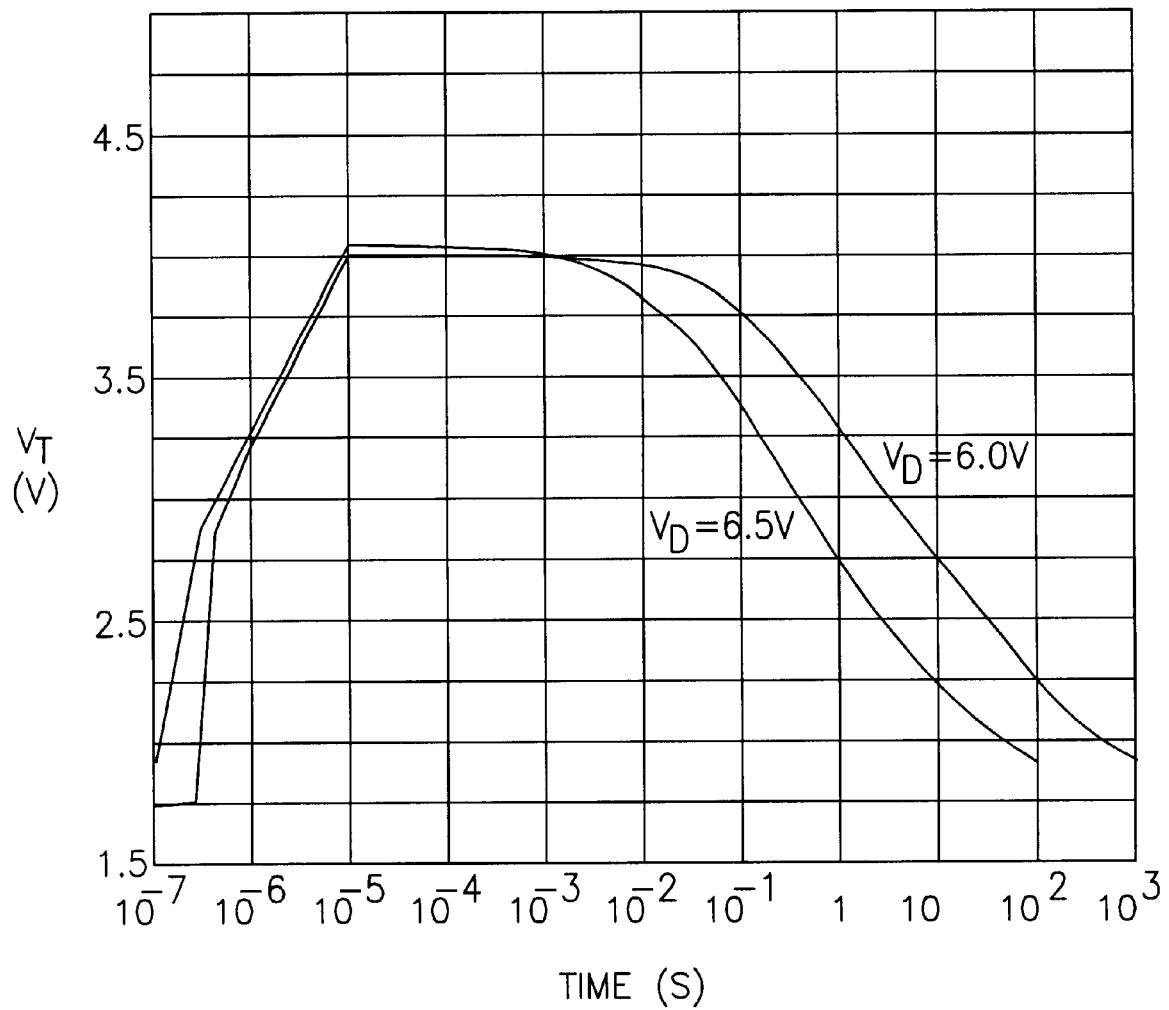
FIG. 16 is a graph illustrating the erase curves for two different values of drain voltage while the gate is held at ground potential.

A graph illustrating erase times for a gate voltage of zero with two different values of drain voltage is shown in FIG. 16. Both curves were generated by first programming in the forward direction for about 10 microseconds, until the threshold voltage $V_T$ equals about 4 V and then erasing in the forward direction. For the upper curve, the gate 24 was grounded and 6.0 V applied to the drain 16, For the lower curve, the gate 24 was grounded and 6.5 V applied to the drain. For both curves, the threshold voltage is raised during programming from nearly 1.5 V to approximately 4 V. Erasing then brings the $V_T$ back down to approximately 1.7 V. Note that the time to erase the charge from the dielectric decreases as the drain voltage increases. The curves show that it takes about 100 seconds with a gate voltage of 6.5 V to erase (i.e., remove) sufficient charge from the dielectric to bring the threshold voltage of the device down to about 1.9 V and that it takes about 1000 seconds with a gate voltage of 6.0 V to achieve the same threshold voltage.

Figure 17:
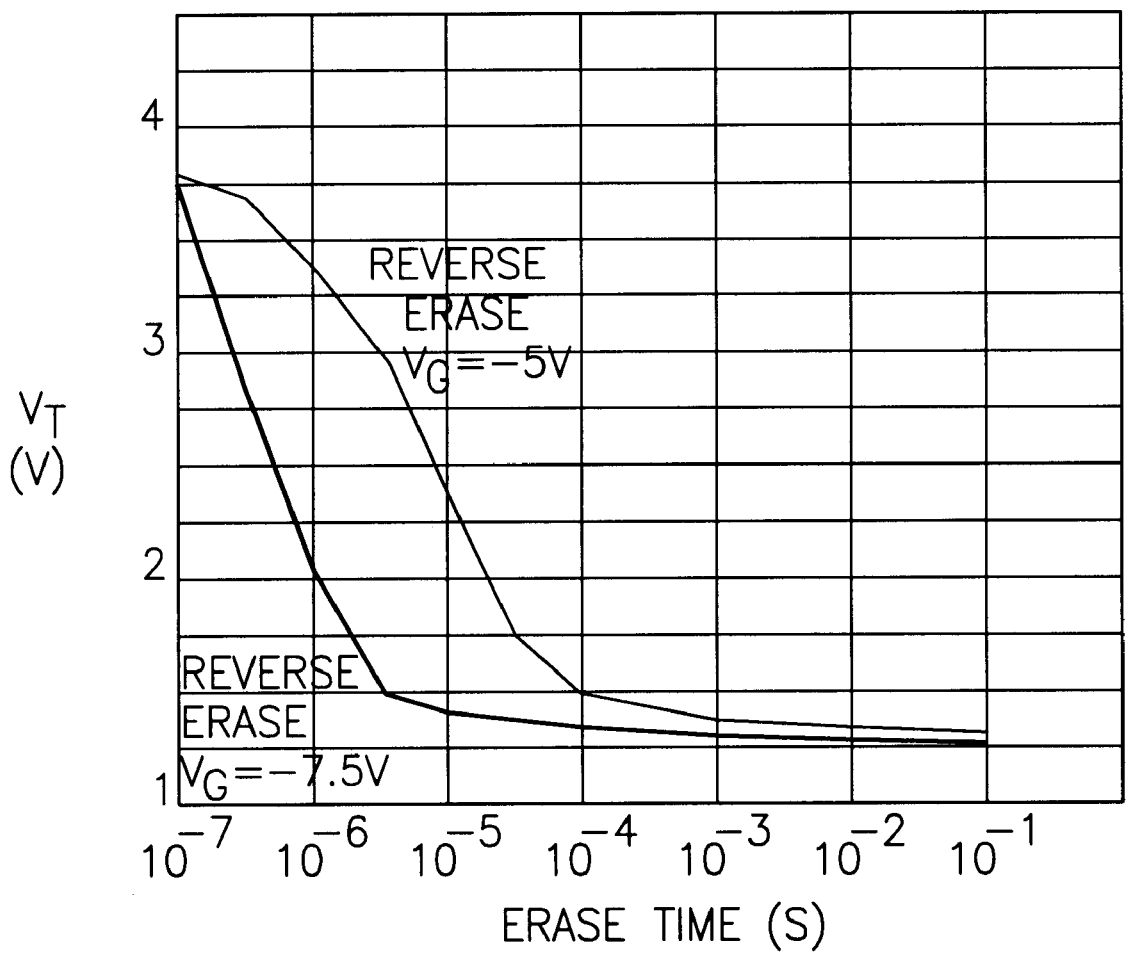
FIG. 17 is a graph illustrating the erase curves of threshold voltage $V_T$ versus erase time for two difference values of negative gate voltage.

A graph illustrating the erase curve for two different values of negative gate voltage is shown in FIG. 17. The graph presented in FIG. 17 was constructed using data obtained from a memory cell constructed in accordance with the present invention. The thickness of each of the top oxide 22, bottom oxide 18 and nitride 20 layers is 100 Angstroms for a total dielectric thickness of 300 Angstroms. The channel width/length ratio is 0.6/0.65 microns. For the reverse direction, a constant $V_D$ of 5.5 V and a $V_G$ of –5 V versus a $V_G$ Of –7.5 V were utilized. The graph shows that drain and gate voltages on the order of 5 V and –5 V respectively, are sufficient to enable an effective erase. This is a big advantage over the prior art where erase voltages of around –10 V on the gate are more typical. The graph also shows that lowering $V_G$ to –7.5 V is effective to erase the device approximately 20 times faster while still retaining a $V_G$ less than 10 V.

Benefits of Reading in the Reverse Direction

Reading the graph in FIG. 10, one can see that to achieve a $V_X$ equal to approximately 2 V in the channel (i.e., the same conditions as the prior art memory device with 3 V applied to the gate) when reading in the reverse direction, approximately 4 V must be applied to the gate. When, for example, 3 V is applied to the gate and the device is read in the reverse direction, only approximately 1.2 V is generated in the channel. This is in direct contrast to the prior art reading in the forward direction wherein the potential across the trapped charge region was almost the full potential applied to the drain (i.e., 2 v). This significant benefit of reading in the reverse direction is that for the same gate voltage a much lower voltage is present across the portion of the channel under the region of trapped charge. This results in dramatically less leakage current for the same charge trapping length. Or stated another way, a shorter charge trapping region is needed in the gate dielectric to achieve an equivalent amount of leakage current. A shorter charge trapping region translates through an exponential function to shorter programming times. A discussion of the variation in programming time as a function of various parameters, voltage and temperature is given in a paper entitled "Hot-Electron Injection Into the Oxide in n-Channel MOS Devices," B. Eitan and D; Frohman-Bentchkowsky, IEEE Transactions on Electron Devices, March 1981, incorporated herein by reference.

The effect of reading the memory device in the reverse direction is to amplify the effect of the trapped charge (i.e., the programmed region or the localized trapping region) on the threshold voltage thereby allowing much less charge to be trapped to achieve the same difference in threshold voltage between the programmed state (i.e., charge stored in the charge trapping region of the gate dielectric) and the unprogrammed state (i.e., no charge stored in the charge trapping region of the gate dielectric) of the device. For the same programming time (meaning the same length of trapped charge in the nitride, for example as shown in FIGS. 5A and 5 B), device 10, when read in the reverse direction, exhibits a leakage current $I_L$ approximately two orders of magnitude less than that of a prior art memory cell. As previously discussed, by reading in the reverse direction, a major benefit is that the programming time can be reduced because the leakage current is significantly less and thus less trapped charge is required to achieve the same leakage current as when reading in the forward direction. Thus, the size of the trapping region does not have to be as large as with prior art memory cells which translates exponentially into shorter programming times.

A key advantage of reading in the opposite direction from programming is that the effect of the lateral electric field next to the charge trapping region is minimized. In addition, the gate voltage can be reduced to further minimize the potential in the channel. In fact, the gate voltage can be set to achieve the desired voltage in the channel. This was described previously with reference to FIG. 10. Reducing the gate voltage while reading in the reverse direction minimizes the transfer of high voltage to the trapped charge region.

Figure 18A:
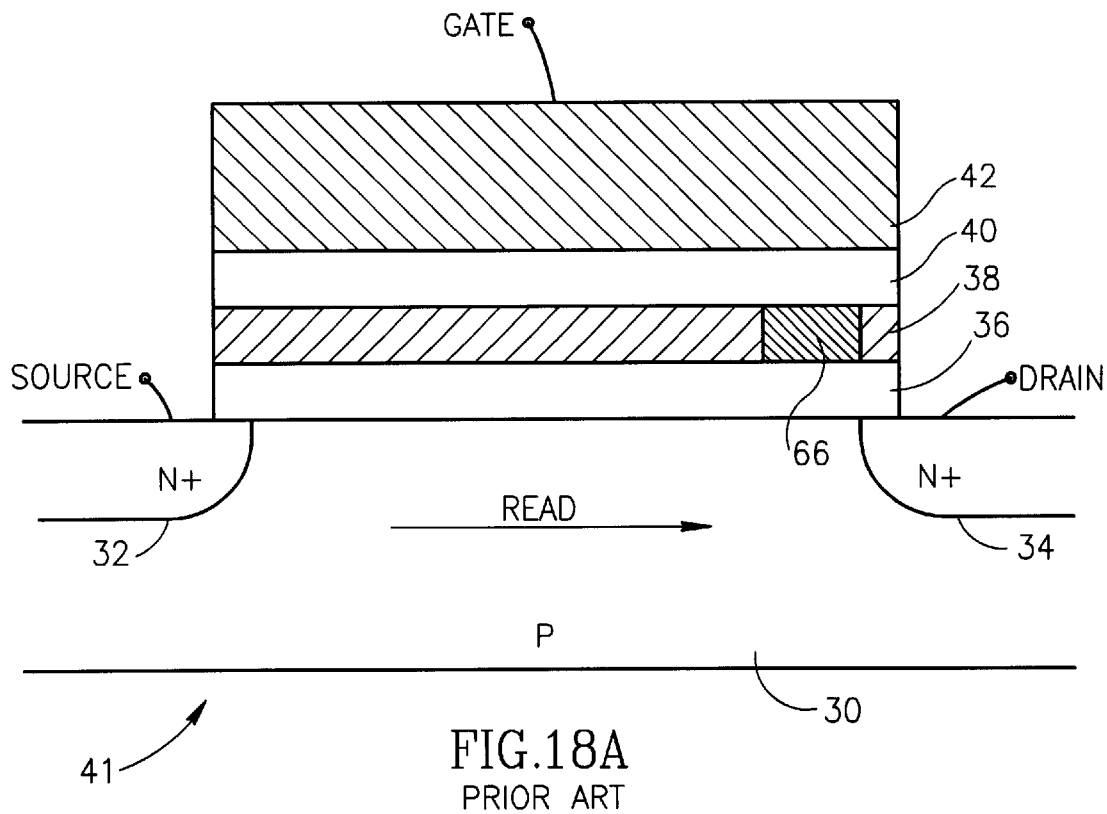
FIG. 18A illustrates a sectional view of a flash EEPROM cell of the prior art showing the area of charge trapping under the gate after the cell has been programmed for a period of time to allow the cell to be read in the forward direction.
Figure 18B:
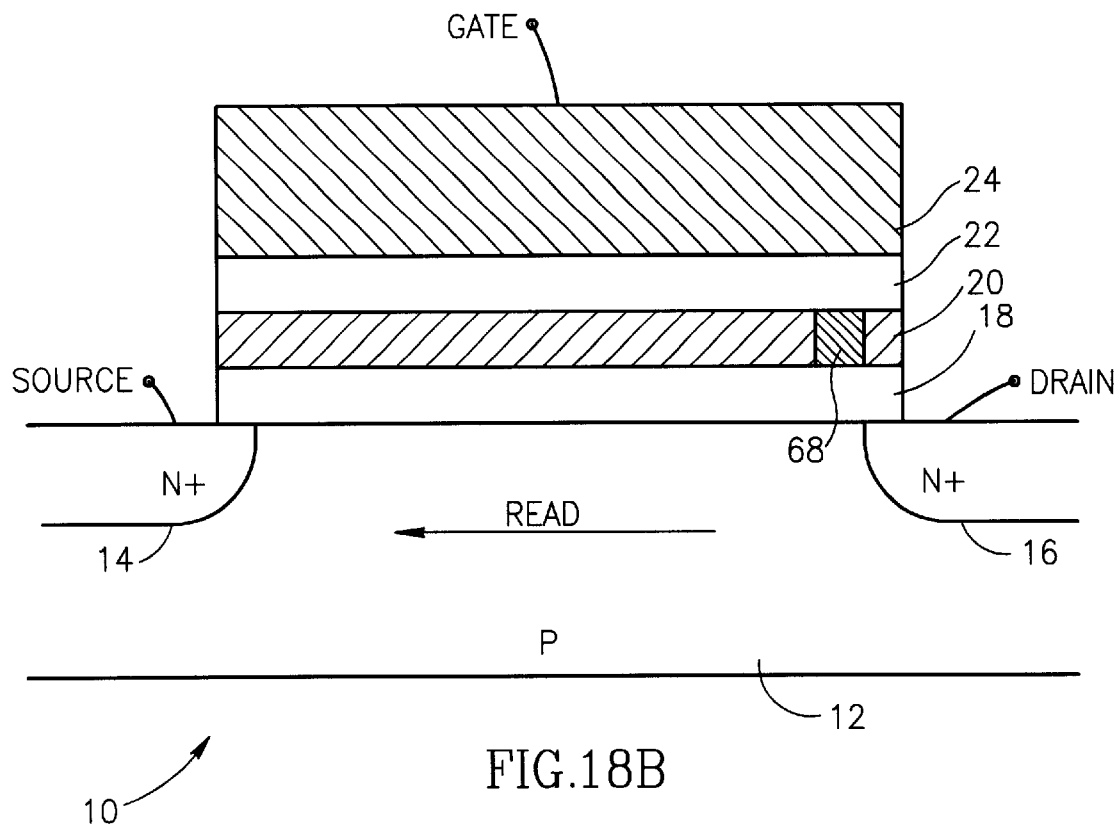
FIG. 18B illustrates a sectional view of a flash EEPROM cell constructed in accordance with an embodiment of the present invention showing the area of charge trapping under the gate after the cell has been programmed for a sufficient time to allow the cell to be read in the reverse direction while achieving the same threshold voltage of the cell illustrated in FIG. 18A.

The area of charge trapping necessary to program memory cell 41 of the prior art is illustrated in FIG. 18A and the area of charge trapping necessary to program memory cell 10 of the present invention is illustrated in FIG. 18B. The trapping region 68 of device 10 is shown much smaller than trapping region 66 of the prior art device. As described earlier, reading in the reverse direction permits a smaller (i.e., shorter) charge trapping region.

Programming a smaller, narrower region of trapped charge has numerous benefits. One major benefit is that programming times are reduced while the delta in threshold voltage between the programmed versus unprogrammed states remain the same. Thus, short programming times are achieved by taking advantage of the asymmetric characteristics of the trapping dielectric flash EEPROM memory cell. Another major benefit is that the erase mechanism of the memory cell is greatly enhanced.

Programming in the forward direction and reading in the reverse direction enables limiting the width of the charge trapping region to a narrow region near the drain. This allows for much more rapid and thus more efficient erasing of the memory cell.

Yet another benefit of reading in the reverse direction, as described above, is that a narrow charge trapping region increases the effectiveness of the gate voltage during erase when combined with relatively low applied gate voltages. A narrow charge trapping region is allowed only by reading in the reverse direction while applying low gate voltages during the read.

Further, utilizing a thinner silicon nitride charge trapping layer than disclosed in the prior art helps to confine the charge trapping region to a region near the drain that is laterally narrower than in the prior art. This improves the retention characteristic of the memory cell. Further, the thinner top and bottom oxide sandwiching the nitride layer helps retain the vertical electric field.

In addition, when the memory cell is read in the reverse direction, it is more tolerant of over programming. Reading in the forward direction, causes the threshold voltage of the memory cell to be very sensitive to inaccuracies in programming time while reading in the reverse direction reduces this sensitivity of threshold voltage to programming time. Over programming while programming to allow reading in the forward direction can potentially cause the device to become non erasable.

The voltage $V_X$ in the channel is a function of the gate voltage and the impurity level in the channel. $V_X$ is the voltage in the channel just beneath the edge of the trapped charge region above the channel (FIG. 5B). A higher gate voltage translates to a higher voltage in the channel. When the device is N channel, the impurity in the channel region before inversion is usually boron. But the voltage $V_X$ is generally independent of the boron impurity level over a normal range of values in the forward reading mode, but $V_X$ is dependent on the impurity level in the reverse direction, becoming smaller as the impurity level goes up. Indeed in the reverse direction the voltage $V_X$ in the channel just beneath the edge of the trapped charge region is given by the following expression $$V_X = V_G - (V_T + \Delta V_T)$$

where $V_T$ is the device threshold voltage for zero substrate bias and $\Delta V_T$ is the incremental increase in threshold voltage due to substrate back bias caused by a finite value for $V_X$ when the channel is just inverted.

Various thicknesses were tried for the second oxide layer 22 in the ONO structure of FIGS. 5B and 18B. The following table presents the combinations of thicknesses for the ONO layers that were constructed for three embodiments of the memory cell of this invention. Note that all thicknesses are in Angstroms in the table below.

| Layer | Embodiment #1 | Embodiment #2 | Embodiment #3 |
| --- | --- | --- | --- |
| Top Oxide ('O' Layer 22) | 150 | 100 | 70 |
| Nitride ('N' Layer 20) | 50 | 50 | 50 |
| Bottom Oxide ('O' Layer 18) | 70 | 70 | 70 |
| Total Thickness | 270 | 220 | 190 |

The nitride layer 20 retains the stored charge. By employing the reverse read as opposed to the forward read, the amount of charge required to be retained for a given shift in threshold voltage is reduced by a factor typically of two or more. By making the nitride layer 20 thinner and the top oxide layer 22 thicker, the amount of charge required to be stored on the nitride layer 20 for a given threshold voltage shift is also reduced.

It is also noted that as the thickness of the top oxide layer 22 increased, the lateral fields associated with the charge stored on the 50 Angstrom thick nitride layer 20 decreased slightly. It is also observed that as the thickness of the bottom oxide layer 18 was made thinner, the erase of the charge stored on the nitride layer 20 becomes easier. For a 70 Angstrom thick bottom oxide layer 18, the charge stored on the nitride layer 20 is more easily erased than if the bottom oxide layer 18 is 100 Angstroms thick.

Thus, the conclusion is that the thinner the nitride layer the better for the purposes of the present invention. Nitride layers as thin as 20 Angstroms are believed possible with this invention. The thinner nitride layer reduces the lateral field associated with a given charge stored in a portion of the nitride layer and thus reduces the lateral dispersion of the stored charge as a result of the internally generated electric field associated with the stored charge.

Optimization Parameters

In terms of optimization, three parameters can be varied to give the quickest programming time and the widest margins. The first parameter is the channel length. A longer channel length, for a given programming time when reading in the reverse direction, increases the distance between the drain and the trapped charge (effectively, the source and drain designations are flipped). This lowers the level of the lateral electric field even lower.

The second parameter, as described previously, is the gate voltage which can be set to minimize the voltage drop in the channel across the channel region beneath the trapped charge. This further reduces the lateral electric field in the channel beneath the trapped charge. Within limits, the voltage in the channel can be 'dialed in' by varying the voltage on the gate. This allows control over the voltage drop in the channel beneath the region of trapped charge. If the gate voltage is made too low then reading a '1', i.e., the unprogrammed state, becomes problematic. The gate voltage for reading a '1' must be still high enough to generate inversion in order to produce sufficient read current for the sense amplifiers. Thus, a lower limit for the gate voltage is approximately 1 V above the threshold voltage. An upper limit on the gate voltage is the voltage at which the voltage in the channel just beneath the edge of the region of trapped charge is just below the voltage potential applied to the source terminal during reading in the reverse direction. A too high gate voltage will cause inversion in the channel and the benefits of the present invention are lost. Thus, it is not recommended to apply a gate voltage which generates a high voltage in the channel beneath the edge of the charge trapping region because it defeats the benefits of having a lower potential across the portion of the channel beneath the charge trapping region with the accompanying reduction in leakage current and shortened programming time. In a preferred embodiment of the present invention, the gate voltage used for reading is approximately 3 V which represents an optimized tradeoff between programming time and leakage current.

The third optimization method, previously described and which is known in the art, is to vary the boron doping of the channel region under the gate. An increase in the doping concentration results in a higher threshold voltage $V_T$ and a lower voltage generated in the channel. This is due to the reduction in the width of the depletion region formed. Thus, a higher doping concentration permits a higher gate voltage to be applied for the same voltage across the portion of the channel beneath the charge trapping region.

In addition, an increase in the $N_A$ doping concentration for the same length trapping region will improve the punch through behavior of the device. By varying the level of boron implanted in the channel region, the width of the depletion region under the gate can be varied. An increase in the doping concentration results in a reduction in the width of the depletion region for the same applied gate voltage. The reduction in the width of the depletion region occurs because there is now more fixed charge in the substrate. Thus, varying the doping concentration can be used to limit the length of the pinchoff region under the gate. In addition, the doping concentration can be used to increase or decrease the initial threshold voltage of the device.

While the invention has been described with respect to a limited number of embodiments, it will be appreciated that many variations, modifications and other applications of the invention may be made.

What is claimed is:

1. A method of programming, reading, and erasing an electrically erasable programmable read only memory (EEPROM) cell, said memory cell having a source and a drain with a channel therebetween and a gate above said channel but separated therefrom by a non conducting charge trapping material sandwiched between first and second silicon dioxide layers, said method comprising:

programming in a forward direction by injecting electrical charge into said charge trapping material utilizing hot electron injection for a sufficient time that an amount of electrical charge becomes trapped asymmetrically in a charge trapping region of said charge trapping material close to said drain, said electrical charge being injected until the threshold voltage of said cell reaches a predetermined level when said memory cell is read in a direction opposite from which it was programmed, said amount of charge being small enough to be generally fully erased during an erase operation, said injecting being caused by applying programming voltages to said drain and said gate and grounding said source;

reading in said direction opposite from which it was programmed by applying read voltages to said source and said gate and grounding said drain, and subsequently sensing whether or not current flows between said memory cell source and drain; and erasing said memory cell by applying erasing voltages to said gate and said drain so as to cause electrons to be removed from said charge trapping region.

2. The method according to claim 1, wherein the gate voltage during said reading is between a gate voltage at which sufficient inversion is generated in said channel whereby an unprogrammed state can be sensed, and a gate voltage at which the voltage across a portion of said channel beneath said charge trapping region formed during said programming is below the voltage applied to said source during said reading.

3. A method of programming, reading, and erasing an electrically erasable programmable read only memory (EEPROM) cell, said memory cell having a source, a drain spaced from said source, a channel between said source and drain, a gate overlying said channel, and a non conducting charge trapping material sandwiched between first and second silicon dioxide layers formed between said gate and said channel, said method comprising:

programming in a forward direction by injecting electrical charge into said charge trapping material utilizing hot electron injection for a sufficient time such that an amount of electrical charge becomes trapped asymmetrically in a charge trapping region of said charge trapping material close to said drain, said electrical charge being injected until the threshold voltage of said cell reaches a predetermined level when said memory cell is read in a direction opposite from which it was programmed, said amount of charge being small enough to be generally fully erased during an erase operation, said injecting being caused by applying programming voltages to said drain and said gate and grounding said source;

reading in said direction opposite from which it was programmed by applying read voltages to said source and said gate and grounding said drain, and subsequently sensing whether or not current flows between said memory cell source and drain; and erasing said memory cell by applying a selected potential to said gate and said drain so as to cause electrons to be removed from said charge trapping region via said drain.

4. The method according to claim 3, wherein the selected potential applied to said gate is ground potential.

5. The method according to claim 3, wherein the selected potential applied to said gate is a negative potential.

6. A method of programming, reading, and erasing an electrically erasable programmable read only memory (EEPROM) cell, said memory cell having a semiconducting substrate of a first conductivity type, a first region of a second conductivity type opposite to said first conductivity type formed in said substrate, a second region of a second conductivity type opposite to said first conductivity type formed in said substrate, said second region being spaced from said first region, a channel formed in said substrate between said first region and said section region, a conductive gate overlying said channel, and a non conducting charge trapping material sandwiched between first and second silicon dioxide layers formed between said gate and said channel, said method comprising:

programming in a forward direction by:
applying a first programming voltage to said gate;
applying a second programming voltage to said second region; and
coupling said first region to ground;
thereby to inject electrical charge into said charge trapping material utilizing hot electron injection for a time sufficient to cause enough electrical charge to become trapped asymmetrically in a charge trapping region of said charge trapping material in close vicinity to said second region such that the threshold voltage of said cell is at least at a predetermined level when said memory cell is read in a direction opposite from which it was programmed, said amount of charge being small enough to be generally fully erased during an erase operation;

reading in said direction opposite from which it was programmed by:
applying a first read voltage to said gate;
applying a second read voltage to said first region;
coupling said second region to ground; and
sensing whether or not current flows between said memory cell between said first and second regions;
wherein said first read voltage is between the voltage at which sufficient inversion is generated in said channel to allow an unprogrammed state to be sensed, and the voltage at which the voltage across a portion of said channel beneath said charge trapping region is below said second read voltage; and erasing said memory cell by:
applying a first erase voltage to said gate; and
applying a second erase voltage to said second region;
wherein said first and second erase voltages are sufficient to cause electrons to be removed from said charge trapping region.

7. A method of erasing a non-volatile electrically erasable and programmable semiconductor memory cell utilizing asymmetrical charge trapping, said memory cell comprising a semiconductor substrate of a first conductivity type having formed therein a source region and a drain region each of a second conductivity type opposite said first conductivity type, said memory cell further having formed therein a channel between said source and drain regions, a dielectric overlying said channel, said dielectric including at least a silicon nitride layer for the capture and retention of localized charge in a portion of said silicon nitride layer closest to and above said drain region, a conductive gate overlying said dielectric, and said cell having a charge in a portion of said silicon nitride layer, said method of erasing comprising:

placing an amount of charge on said portion of said silicon nitride layer located near said drain region, said step of placing having a first direction, said amount of charge being small enough to be generally fully erased during an erase operation and to be sensible when said cell is read in a direction opposite of said first direction; and during said erase operation, applying a first voltage to said drain region, said first voltage being sufficient to cause generally all of said charge stored in said silicon nitride layer to travel from said silicon nitride layer to said drain region, thereby to remove electrons from said portion of said silicon nitride layer through said drain region.

8. The method of claim 6 wherein said first erase voltage is in a range of 10 to 18 volts and said second erase voltage is ground potential.

9. The method of claim 6 wherein said first erase voltage is approximately 8 volts or less and said second erase voltage is approximately 6 volts or less.

10. The method of claim 6 wherein said non conducting charge trapping material and said first and second silicon dioxide layers each have a thickness of 100 angstroms or less.

11. The method of claim 7 wherein said first voltage is 7 volts or less.

12. The method of claim 7 including applying a second voltage to said conductive gate, said second voltage being less than said first voltage.

13. The method of claim 12 wherein said first voltage is 5 volts or less and said second voltage is −8 volts or less.

14. The method of claim 12 wherein the thickness of said silicon nitride layer is 100 angstroms or less.

15. The method of claim 12 wherein said second voltage is sufficient to cause an electric field covering said localized charge.

* * * * *